(12) United States Patent
Chen et al.

(10) Patent No.: US 10,651,035 B2
(45) Date of Patent: May 12, 2020

(54) MASK ASSEMBLY AND METHOD FOR FABRICATING A CHIP PACKAGE

(71) Applicant: Taiwan Semiconductor Manufacturing Co., Ltd., Hsinchu (TW)

(72) Inventors: Jie Chen, New Taipei (TW);
Hsien-Wei Chen, Hsinchu (TW);
Tzuan-Horng Liu, Taoyuan County (TW); Ying-Ju Chen, Yunlin County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 83 days.

(21) Appl. No.: 15/884,328

(22) Filed: Jan. 30, 2018

(65) Prior Publication Data
US 2019/0067001 A1 Feb. 28, 2019

Related U.S. Application Data

(60) Provisional application No. 62/552,401, filed on Aug. 31, 2017.

(51) Int. Cl.
*H01L 23/544* (2006.01)
*G03F 9/00* (2006.01)
(Continued)

(52) U.S. Cl.
CPC ......... *H01L 21/0274* (2013.01); *H01L 21/56* (2013.01); *H01L 21/6835* (2013.01); *H01L 21/78* (2013.01); *H01L 23/3128* (2013.01);
*H01L 23/49827* (2013.01); *H01L 23/49838* (2013.01); *H01L 23/544* (2013.01);
(Continued)

(58) Field of Classification Search
CPC ....... H01L 2223/54426; H01L 21/0274; H01L 23/544; H01L 2224/02331; H01L 2224/0231; H01L 2224/02313; H01L 21/76807; H01L 21/6835; H01L 21/78; H01L 21/76838; H01L 21/76877;
(Continued)

(56) References Cited

U.S. PATENT DOCUMENTS 9,000,584 B2   4/2015   Lin et al.
9,048,222 B2   6/2015   Hung et al.
(Continued)

FOREIGN PATENT DOCUMENTS

CN    104155844    11/2014
CN    106653615     5/2017
(Continued)

OTHER PUBLICATIONS

"Office Action of Taiwan Counterpart Application", dated May 29, 2019, pp. 1-4.
(Continued)

*Primary Examiner* — Latanya N Crawford
(74) *Attorney, Agent, or Firm* — JCIPRNET

(57) ABSTRACT

A first mask and a second mask are sequentially provided to perform a multi-step exposure and development processes. Through proper overlay design of the first mask and the second mask, conductive wirings having acceptable overlay offset are formed.

20 Claims, 22 Drawing Sheets

(51) Int. Cl.
*H01L 21/027* (2006.01)
*H01L 23/00* (2006.01)
*H01L 23/498* (2006.01)
*H01L 21/56* (2006.01)
*H01L 21/78* (2006.01)
*H01L 23/31* (2006.01)
*H01L 21/683* (2006.01)
*H01L 25/10* (2006.01)
*H01L 21/66* (2006.01)
*H01L 25/065* (2006.01)

(52) U.S. Cl.
CPC .............. *H01L 24/05* (2013.01); *H01L 24/08* (2013.01); *H01L 24/19* (2013.01); *H01L 24/20* (2013.01); *H01L 21/568* (2013.01); *H01L 22/14* (2013.01); *H01L 24/13* (2013.01); *H01L 24/14* (2013.01); *H01L 25/0657* (2013.01); *H01L 25/105* (2013.01); *H01L 2221/68318* (2013.01); *H01L 2221/68359* (2013.01); *H01L 2221/68372* (2013.01); *H01L 2221/68381* (2013.01); *H01L 2223/5442* (2013.01); *H01L 2223/54426* (2013.01); *H01L 2223/54486* (2013.01); *H01L 2224/02311* (2013.01); *H01L 2224/02317* (2013.01); *H01L 2224/02319* (2013.01); *H01L 2224/02331* (2013.01); *H01L 2224/02379* (2013.01); *H01L 2224/04105* (2013.01); *H01L 2224/05548* (2013.01); *H01L 2224/08265* (2013.01); *H01L 2224/12105* (2013.01); *H01L 2224/13024* (2013.01); *H01L 2224/1403* (2013.01); *H01L 2224/14181* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/94* (2013.01); *H01L 2225/0651* (2013.01); *H01L 2225/06568* (2013.01); *H01L 2225/1023* (2013.01); *H01L 2225/1058* (2013.01); *H01L 2924/15311* (2013.01); *H01L 2924/37001* (2013.01)

(58) Field of Classification Search
CPC ... H01L 21/76816; G03F 7/2002; G03F 9/00; G03F 9/7084; G03F 7/70633
See application file for complete search history.

(56) References Cited

U.S. PATENT DOCUMENTS

| | | | |
|---|---|---|---|
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,666,522 | B2 * | 5/2017 | Huang ............... H01L 21/76802 |
| 9,991,207 | B2 * | 6/2018 | Chen .................... H01L 23/544 |
| 10,163,805 | B2 * | 12/2018 | Hsieh .................... H01L 23/544 |
| 10,276,428 | B2 * | 4/2019 | Liu .................... H01L 21/76807 |
| 10,319,707 | B2 * | 6/2019 | Chen ...................... H01L 25/50 |
| 2017/0125346 | A1 * | 5/2017 | Liu ...................... H01L 23/5389 |
| 2017/0250139 | A1 * | 8/2017 | Huang ............... H01L 21/76802 |
| 2017/0271283 | A1 * | 9/2017 | Lee ........................ H01L 24/02 |
| 2017/0278802 | A1 * | 9/2017 | Chen .................... H01L 23/544 |
| 2018/0005955 | A1 * | 1/2018 | Hsieh .................... H01L 23/544 |
| 2018/0151502 | A1 * | 5/2018 | Lin ......................... H01L 24/20 |
| 2019/0067086 | A1 * | 2/2019 | Liu ................... H01L 21/76807 |

FOREIGN PATENT DOCUMENTS

| | | |
|---|---|---|
| CN | 106997153 | 8/2017 |
| CN | 107093584 | 8/2017 |
| JP | S63275115 | 11/1988 |
| JP | 06045581 | 2/1994 |
| JP | 5466715 | 4/2014 |
| JP | 2015230962 | 12/2015 |
| KR | 20020075415 | 10/2002 |
| KR | 20150030134 | 3/2015 |
| KR | 20150137969 | 12/2015 |
| TW | 201715674 | 5/2017 |

OTHER PUBLICATIONS

"Office Action of Korea Counterpart Application", dated Jun. 28, 2019, pp. 1-6.

"Office Action of Korea Counterpart Application" with (partial) English translation thereof, dated Mar. 3, 2020, pp. 1-7.

"Office Action of China Counterpart Application", with (partial) English translation thereof, dated Mar. 2, 2020, pp. 1-13.

* cited by examiner

FIG. 20A                    FIG. 20B

MASK ASSEMBLY AND METHOD FOR FABRICATING A CHIP PACKAGE

CROSS-REFERENCE TO RELATED APPLICATION

This application claims the priority benefit of U.S. provisional application Ser. No. 62/552,401, filed on Aug. 31, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from gradual reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

The integrated fan-out packages are powerful solutions for heterogeneous integration between chips and system. The improved routability and reliability provided by the integrated fan-out packages are key factors for future packages. How to simplify the fabricating process and reduce the fabrication costs of the integrated fan-out packages is an important issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20A schematically illustrates top views of the first mask M1 shown in FIG. 16A and the overlay portion OL shown in FIG. 16B in accordance with some alternative embodiments of the present disclosure.

FIG. 20B schematically illustrates top views of the second mask M2 shown in FIG. 16C and the overlay portion OL shown in FIG. 16D in accordance with some alternative embodiments of the present disclosure.

DETAILED DESCRIPTION

Figure 1:
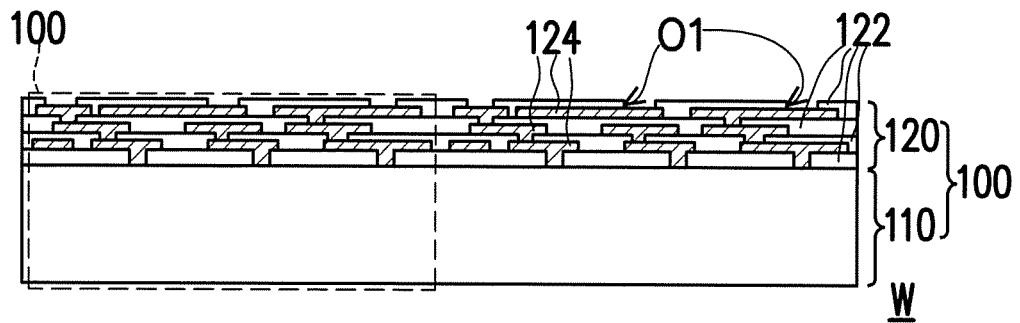
FIGS. 1 through 5 schematically illustrate a process flow for fabricating integrated circuit components in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 5 schematically illustrate a process flow for fabricating integrated circuit components in accordance with some embodiments of the present disclosure. Referring to FIG. 1, a wafer W including a plurality of integrated circuit components 100 arranged in an array is provided. Before a wafer sawing or dicing process is performed on the wafer W, the integrated circuit components 100 of the wafer W are physically connected one another, as shown in FIG. 1. In some embodiments, each of the integrated circuit components 100 includes a semiconductor substrate 110 and an interconnection structure 120 disposed on the semiconductor substrate 110. The semiconductor substrate 110 may be a silicon substrate including active components (e.g., transistors or the like) and passive components (e.g., resistors, capacitors, inductors or the like) formed therein. The interconnection structure 120 may include a plurality of inter-dielectric layers 122 and a plurality of patterned conductive layers 124 stacked alternately. For example, the inter-dielectric layers 122 may be silicon oxide layers, silicon nitride layers, silicon oxy-nitride layers, or dielectric layers formed by other suitable dielectric materials, and the patterned conductive layers 124 may be patterned copper layers or other suitable patterned metal layers.

As shown in FIG. 1, the topmost patterned conductive layer 124 is covered by the topmost inter-dielectric layer 122 of the inter-dielectric layers 120, and the topmost patterned conductive layer 124 is exposed by a plurality of openings O1 of the topmost inter-dielectric layer 124.

Figure 2:
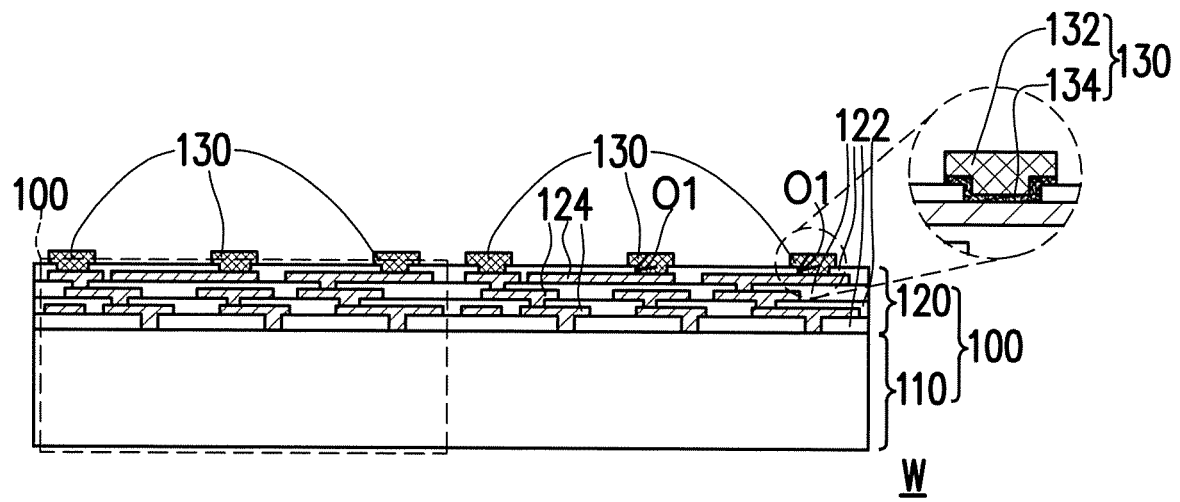

Referring to FIG. 2, a plurality of conductive pillars 130 are formed on the wafer W, the conductive pillars 130 may be formed through a plating process. In some embodiments, a seed layer (e.g., Ti/Cu seed layer) may be sputtered on the wafer W and a patterned photoresist is then formed on the seed layer. The wafer W having the seed layer and the patterned photoresist formed thereon is immersed into a plating bath such that the conductive pillars 130 are plated onto parts of the seed layer that are exposed by the patterned photoresist. The conductive pillars 130 are corresponding to the openings O1 of the topmost inter-dielectric layer 122. After the conductive pillars 130 are plated onto the exposed seed layer, the patterned photoresist is removed. Thereafter, the seed layer is removed and patterned by using the conductive pillars 130 as a hard mask until the topmost inter-dielectric layer 122 is exposed. In some embodiments, the conductive pillars 130 may be copper pillars or other suitable metallic pillars.

As shown in FIG. 2, the conductive pillars 130 may include a pillar portion 132 and a seed pattern 134 between the pillar portion 132 and the topmost patterned conductive layer 124. In some embodiments, the material of the pillar portions 132 of the conductive pillars 130 and that of the topmost patterned conductive layer 124 are substantially the same. The seed patterns 134 of the conductive pillars 130 are in contact with the pillar portion 132 and the topmost patterned conductive layer 124. Through properly selecting of the materials of the seed pattern 134 and the topmost patterned conductive layer 124, the adhesion between the conductive pillars 130 (e.g., the seed pattern 134) and the topmost patterned conductive layer 124 may be enhanced. The copper pillar portion 132 and the Ti/Cu seed pattern 134 have good resistance on electro-migration and have low resistivity, and the interfaces between the topmost patterned conductive layer 124 (e.g. copper layer) and the Ti/Cu seed patterns 134 may induce less equivalent series inductance (ESL) and/or equivalent series resistance (ESR).

Figure 3:
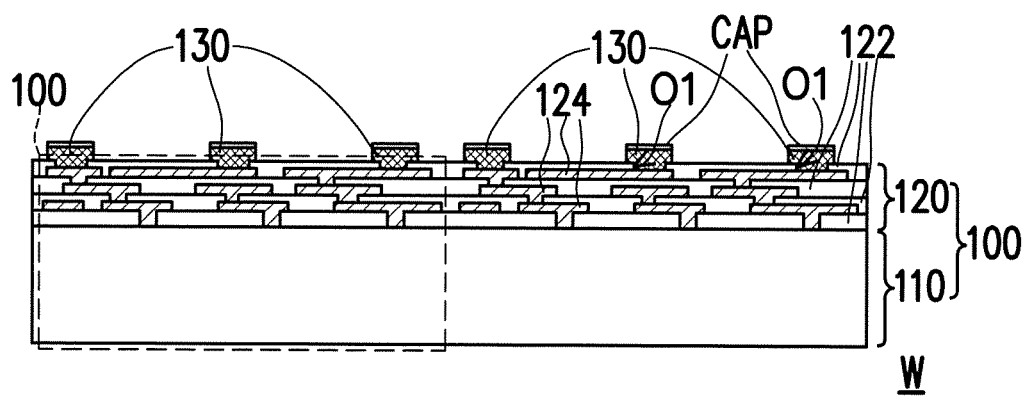
Figure 8:
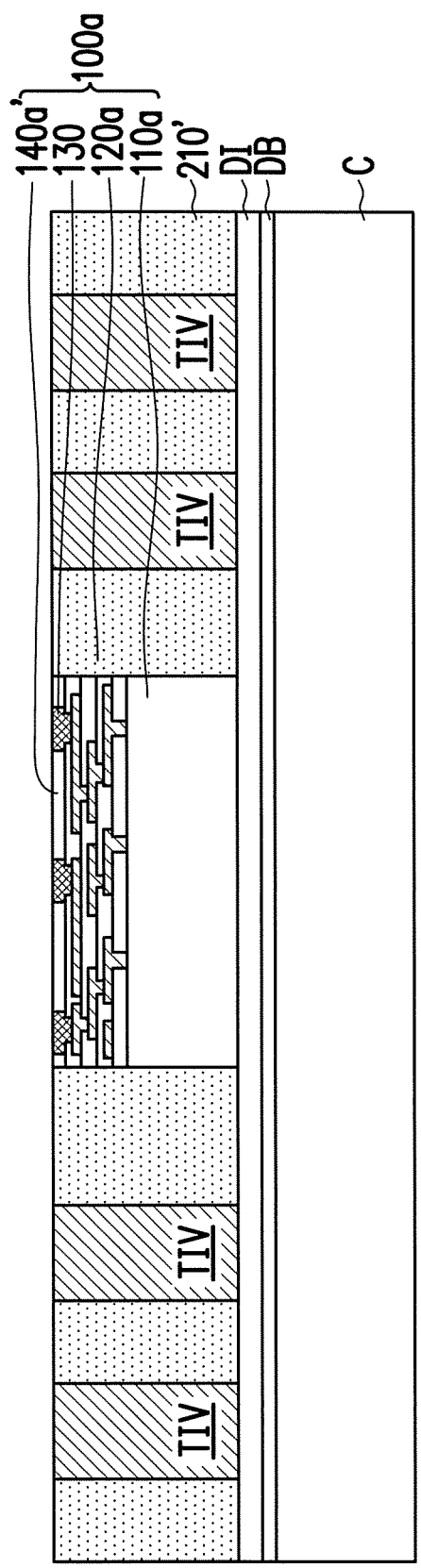

Referring to FIG. 3, in order to inspect the electrical characteristics of the conductive pillars 130 and/or the integrated circuit components 100, a plurality of conductive caps CAP are formed on top surfaces of the conductive pillars 130. In some embodiments, the conductive caps CAP may be solder caps. For example, the above-mentioned solder caps may be lead-free solder caps. Then, a chip-probing process is performed on the conductive caps CAP so as to inspect the electrical characteristics of the conductive pillars 130 and/or the integrated circuit components 100. During the chip-probing process, the inspection probes are pressed onto the conductive caps CAP and the probing marks may be thus formed on the top surfaces of the conductive caps CAP. However, the probing marks formed on the top surfaces of the conductive caps CAP may not deteriorate the reliability of the conductive pillars 130 and the integrated circuit components 100 because the conductive caps CAP will be removed, as shown in FIG. 8.

Figure 4:
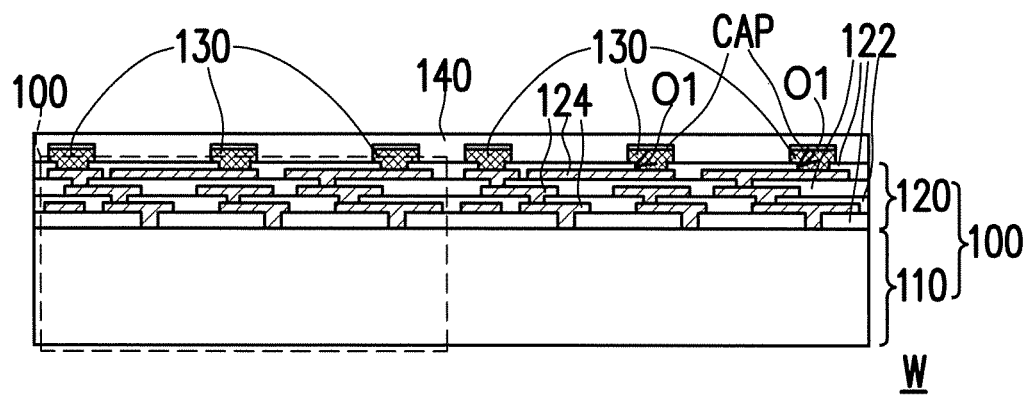

Referring to FIG. 4, a protection layer 140 is formed over the wafer W such that the conductive caps CAP and the conductive pillars 130 are covered or encapsulated by the protection layer 140. The conductive caps CAP and the conductive pillars 130 are protected by the protection layer 140. In some embodiments, the protection layer 140 may be a polyimide (PI) layer, a polybenzoxazole (PBO) layer, or other suitable polymer or organic layer. After the protection layer 140 is formed, a back side grinding process of the wafer W may be performed such that the wafer W is thinned to have a predetermined thickness. During the back side grinding process of the wafer W, the conductive pillars 130 are protected by the protection layer 140a from damage.

Figure 5:
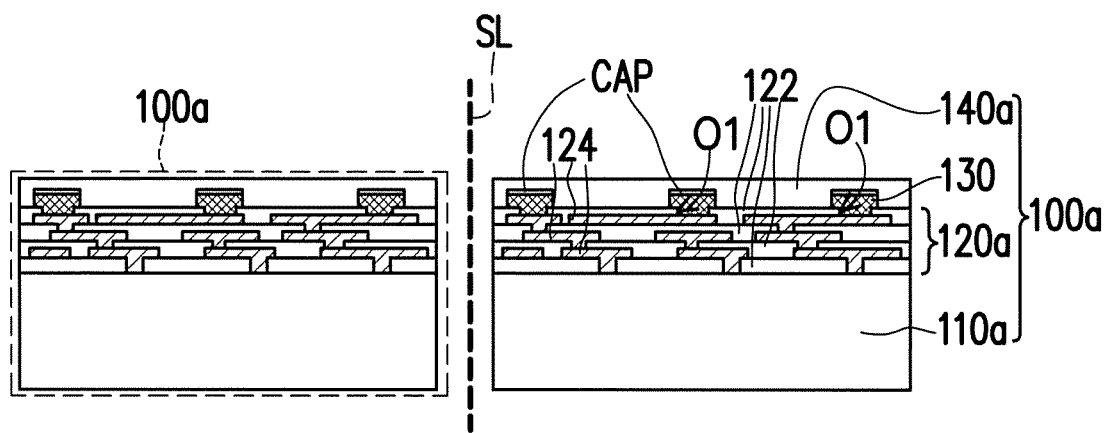

Referring to FIG. 5, a wafer dicing process or a wafer singulation process is performed along the scribe line SL such that the wafer W is singulated into a plurality of integrated circuit components 100a. Each one of the singulated integrated circuit components 100a includes a semiconductor substrate 110a, an interconnection structure 120a disposed on the semiconductor substrate 110a, the conductive pillars 130, and a protection layer 140a. The protection layer 140a covers the interconnection structure 120a. The conductive pillars 130 are encapsulated by the protection layer 140a. During the wafer dicing or singulation process, the conductive pillars 130 are protected by the protection layer 140a from damage.

FIG. 6 through FIG. 13 schematically illustrate a process flow for fabricating a chip package in accordance with some embodiments of the present disclosure.

Figure 6:
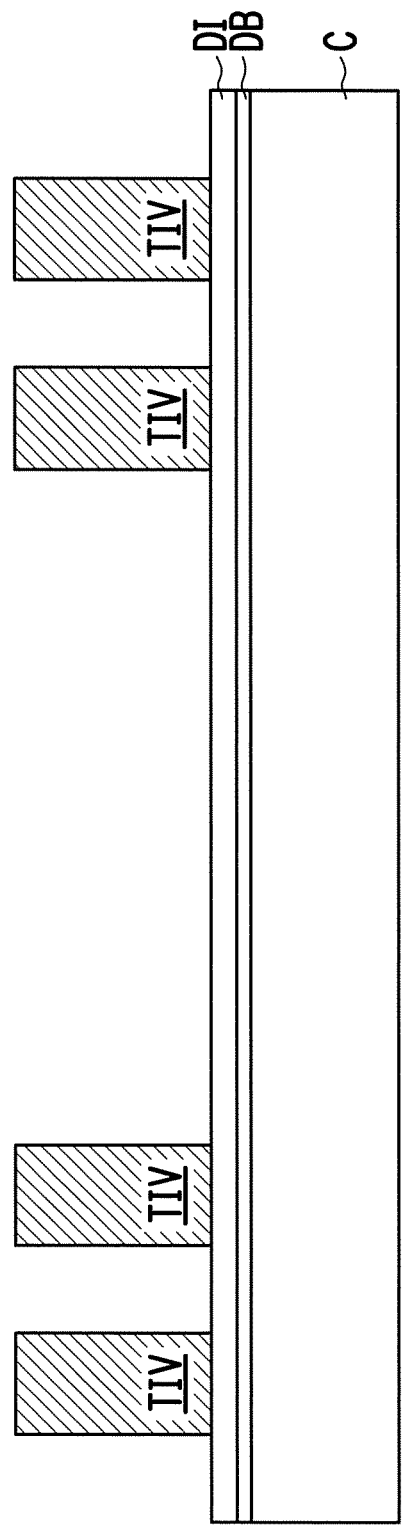
FIG. 6 through FIG. 13 schematically illustrate a process flow for fabricating a chip package in accordance with some embodiments of the present disclosure.

Referring to FIG. 6, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. In some alternative embodiments, the de-bonding layer DB may be a photo-curable release film whose stickiness is decreased by a photo-curing process or a thermal curable release film whose stickiness is decreased by a thermal-curing process, and the dielectric layer DI may be made of other photosensitive or non-photosensitive dielectric materials. After the carrier C having the de-bonding layer DB and the dielectric layer DI formed thereon is provided, a plurality of conductive through insulator vias TIV are formed on the dielectric layer DI. In some embodiments, the conductive through insulator vias TIV is formed by photoresist coating, photolithography, plating, and photoresist stripping process. For example, the conductive through insulator vias TIV include copper posts or other suitable metal posts.

In some embodiments, at least one of the singulated integrated circuit components 100a including the conductive pillars 130 distributed thereon is picked and placed on the dielectric layer DI. The integrated circuit component 100a is attached or adhered on the dielectric layer DI through a die attachment film (DAF), an adhesion paste or the like. In some alternative embodiments, two or more integrated circuit components 100a may be picked and placed on the dielectric layer DI, and the integrated circuit components 100a placed on the dielectric layer DI may be arranged in an array.

Figure 7:
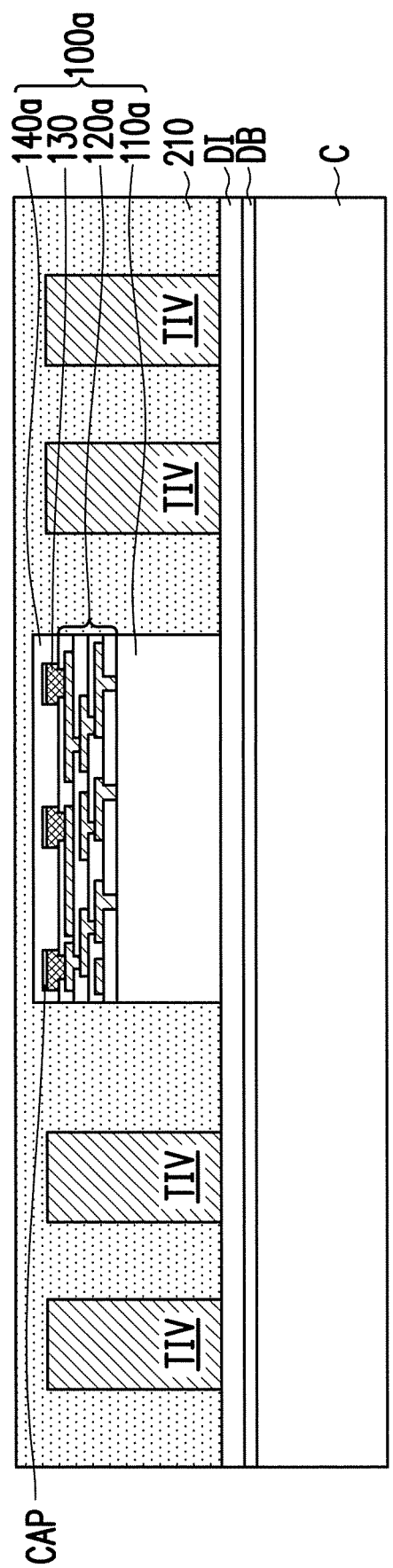

Referring to FIG. 7, the integrated circuit component 100a is picked and placed on the dielectric layer DI. In some embodiments, the integrated circuit component 100a is picked and placed on the dielectric layer DI after the formation of the conductive through insulator vias TIV. In some alternative embodiments, the integrated circuit component 100a is picked and placed on the dielectric layer DI before the formation of the conductive through insulator vias TIV.

As shown in FIG. 7, an insulating encapsulation 210 is formed on the dielectric layer DI to cover the at least one integrated circuit component 100a and the conductive through insulator vias TIV. In some embodiments, the insulating encapsulation 210 is a molding compound formed by a molding process (e.g., a compression molding process). The conductive pillars 130 and the protection layer 140a of the integrated circuit component 100a are covered by the insulating encapsulation 210. In other words, the conductive pillars 130 and the protection layer 140a of the integrated circuit component 100a are not revealed and are protected by the insulating encapsulation 210. In some embodiments, the insulating encapsulation 210 includes epoxy resin or other suitable dielectric materials.

Referring to FIG. 7 and FIG. 8, the insulating encapsulation 210 is grinded until the top surfaces of the conductive vis 130 and the top surface of the protection layer 140a are exposed. In some embodiments, the insulating encapsulation 210 is grinded by a mechanical grinding process and/or a chemical mechanical polishing (CMP) process. After the insulating encapsulation 210 is grinded, an insulating encapsulation 210' is formed over the dielectric layer DI. During the grinding process of the insulating encapsulation 210, the protection layer 140a, the conductive caps CAP, and the conductive pillars 130 are grinded until the top surfaces of the conductive pillars 130 are exposed. Since the conductive caps CAP are grinded, the probing marks formed on the top surfaces of the conductive caps CAP may not deteriorate the reliability of the conductive pillars 130 and the integrated circuit component 100a. After the grinding process of the insulating encapsulation 210 is performed, a grinded protection layer 140a' is formed. In some embodiments, during the grinding process of the insulating encapsulation 210, the conductive through insulator vias TIV are partially grinded also.

As shown in FIG. 8, the insulating encapsulation 210' laterally encapsulates the sidewalls of the at least one integrated circuit component 100a and the insulating encapsulation 210' is penetrated by the conductive through insulator vias TIV. In other words, the integrated circuit component 100a and the conductive through insulator vias TIV are embedded in the insulating encapsulation 210'. It is noted that the top surfaces of the conductive through insulator vias TIV, the top surface of the insulating encapsulation 210', and the top surfaces of the conductive pillars 130 may be substantially coplanar with the top surface of the protection layer 140a'.

Figure 9:
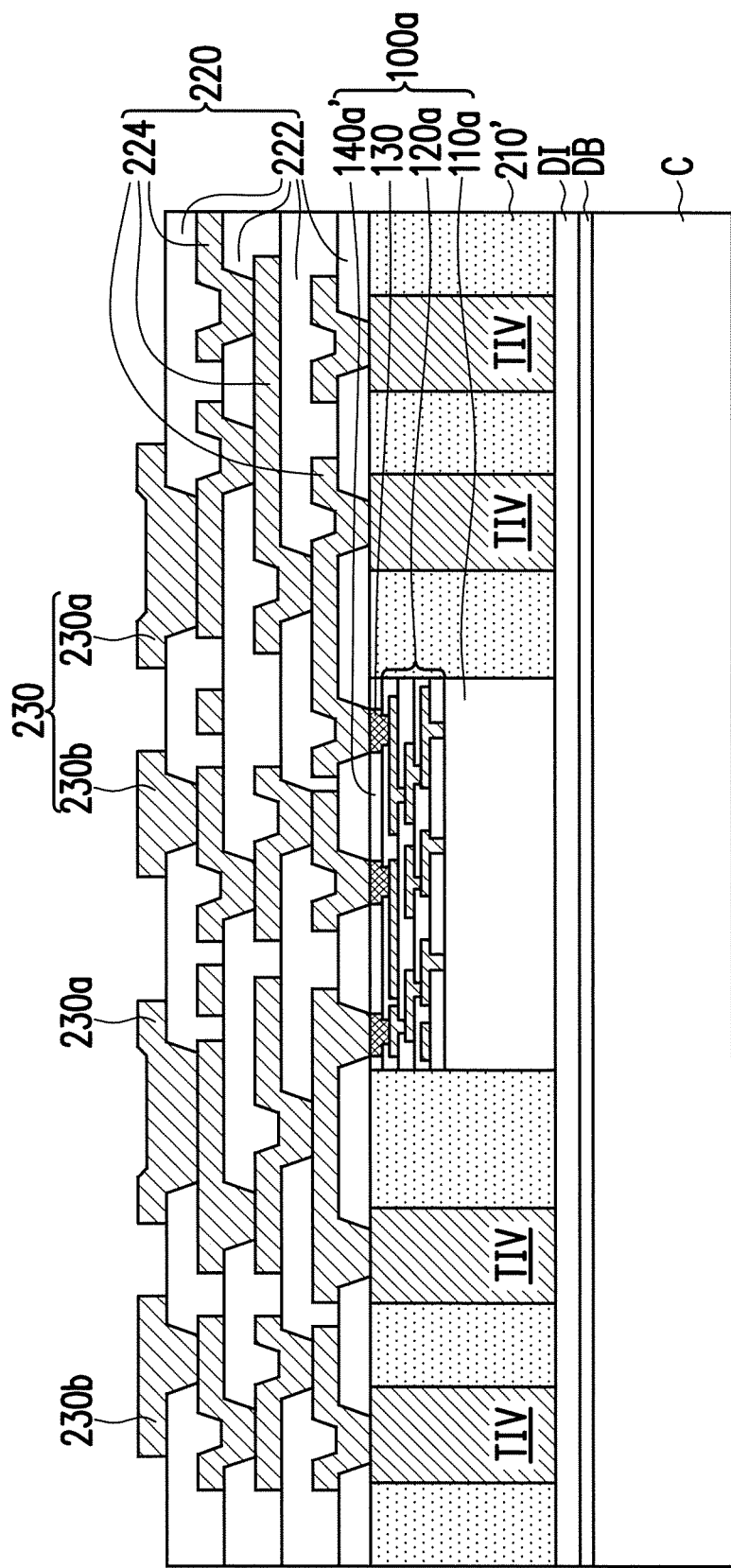

Referring to FIG. 9, after the insulating encapsulation 210' and the protection layer 140a' are formed, a redistribution circuit structure 220 electrically connected to the conductive pillars 130 of the integrated circuit component 100a is formed on the top surfaces of the conductive through insulator vias TIV, the top surface of the insulating encapsulation 210', the top surfaces of the conductive pillars 130, and the top surface of the protection layer 140a'. As shown in FIG. 9, the redistribution circuit structure 220 includes a plurality of inter-dielectric layers 222 and a plurality of redistribution conductive layers 224 stacked alternately. In some embodiments, the top surfaces of the conductive pillars 130 and the top surfaces of the conductive through insulator vias TIV are in contact with the redistribution circuit structure 220. In the present embodiment, as shown in FIG. 9, the inter-dielectric layers 222 includes four inter-dielectric layer 222 and the redistribution conductive layers 224 include three redistribution conductive layers 224, for example.

Furthermore, the pluralities of pads 230 are formed on the topmost one of the inter-dielectric layers 222 and are electrically connected to the topmost one of the redistribution conductive layers 224. The pads 230 include a plurality of under-ball metallurgy (UBM) patterns 230a for ball mount and a plurality of connection pads 230b for mounting of passive components. The pads 230 are electrically connected to the conductive pillars 130 of the integrated circuit component 100a and the conductive through insulator pillars TIV through the redistribution conductive layers 224. It is noted that the number of the UBM patterns 230a and the connection pads 230b is not limited in this disclosure.

Since a layout area of the above-mentioned redistribution circuit structure 220 provided by the at least one integrated circuit component 100a, the insulating encapsulation 210' and the conductive through insulator vias TIV is quite large, the patterning process (i.e. the photolithography process) of the redistribution conductive layers 224 and/or the inter-dielectric layers 222 in the redistribution circuit structure 220 may not be performed via a single mask due to tool capacity. It is noted that the redistribution conductive layers 224 and the inter-dielectric layers 222 may have different patterns, and accordingly, in the present embodiment, different mask configurations each including a plurality of masks may be utilized in the fabrication processes of the redistribution conductive layers 224 and the inter-dielectric layers 222. In some alternative embodiments, the redistribution circuit structure 220 may merely include two inter-dielectric layers 222 and one redistribution conductive layer 224 sandwiched between the two inter-dielectric layers 222. It is noted that the number of the inter-dielectric layer 222 and the redistribution conductive layer 224 is not limited in this disclosure.

The fabrication of at least one of the redistribution conductive layers 224 in the redistribution circuit structure 220 is described in accompany with FIG. 15, FIGS. 16A through 16F, FIGS. 17A through 17C, FIGS. 18A through 18C, FIG. 19 and FIGS. 20A through 20C.

Figure 10:
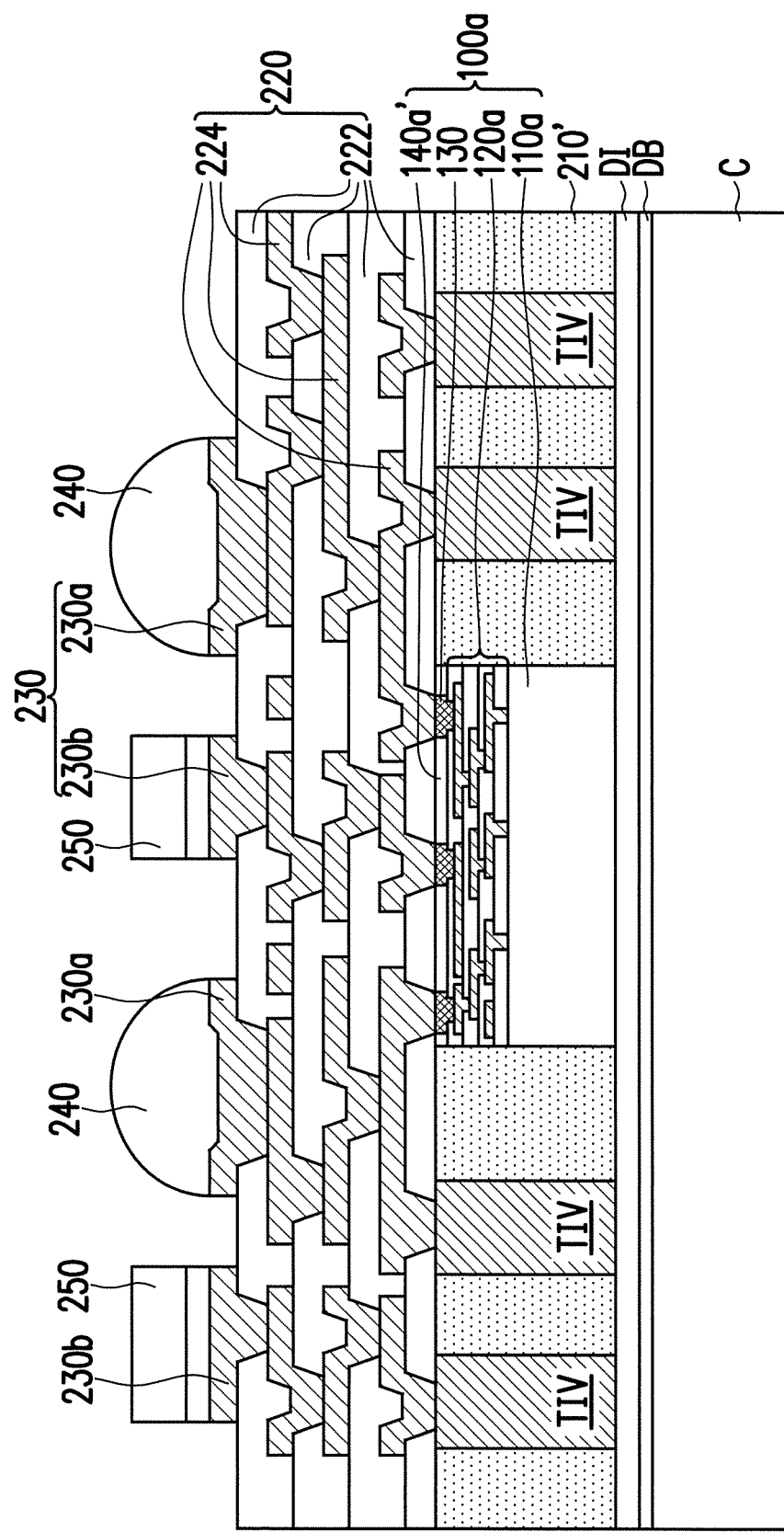

Referring to FIG. 10, after the UBM patterns 230a and the connection pads 230b are formed, a plurality of conductive balls 240 are placed on the under-ball metallurgy patterns 230a, and a plurality of passive components 250 are mounted on the connection pads 230b. In some embodiments, the conductive balls 240 may be placed on the under-ball metallurgy patterns 230a by a ball placement process, and the passive components 250 may be mounted on the connection pads 230b through a solder or reflow process. In some embodiments, the height of the conductive balls 240 is greater than the height of the passive components 250, for example. It is noted that, after the passive components 250 are mounted on the connection pads 230b, the interfaces between the topmost patterned conductive layer 124 (e.g. copper layer) and the Ti/Cu seed patterns 134 may induce less equivalent series inductance (ESL) and/or equivalent series resistance (ESR).

Figure 11:
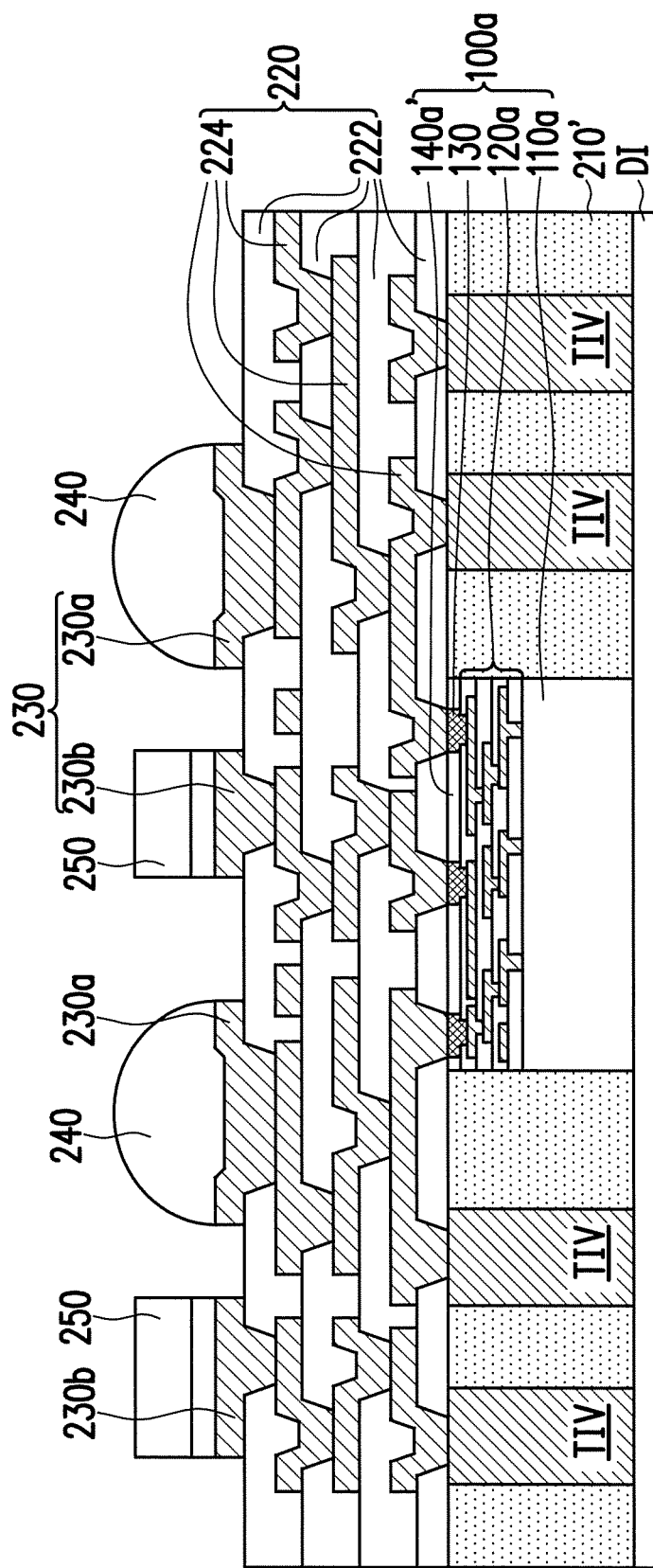

Referring to FIG. 10 and FIG. 11, after the conductive balls 240 and the passive components 250 are mounted on the pads 230, the inter-dielectric layer DI formed on the bottom surface of the insulating encapsulation 210' is de-bonded from the de-bonding layer DB such the inter-dielectric layer DI is separated from the carrier C. In some embodiments, the de-bonding layer DB (e.g., the LTHC release layer) may be irradiated by an UV laser such that the inter-dielectric layer DI is peeled from the carrier C.

Figure 12:
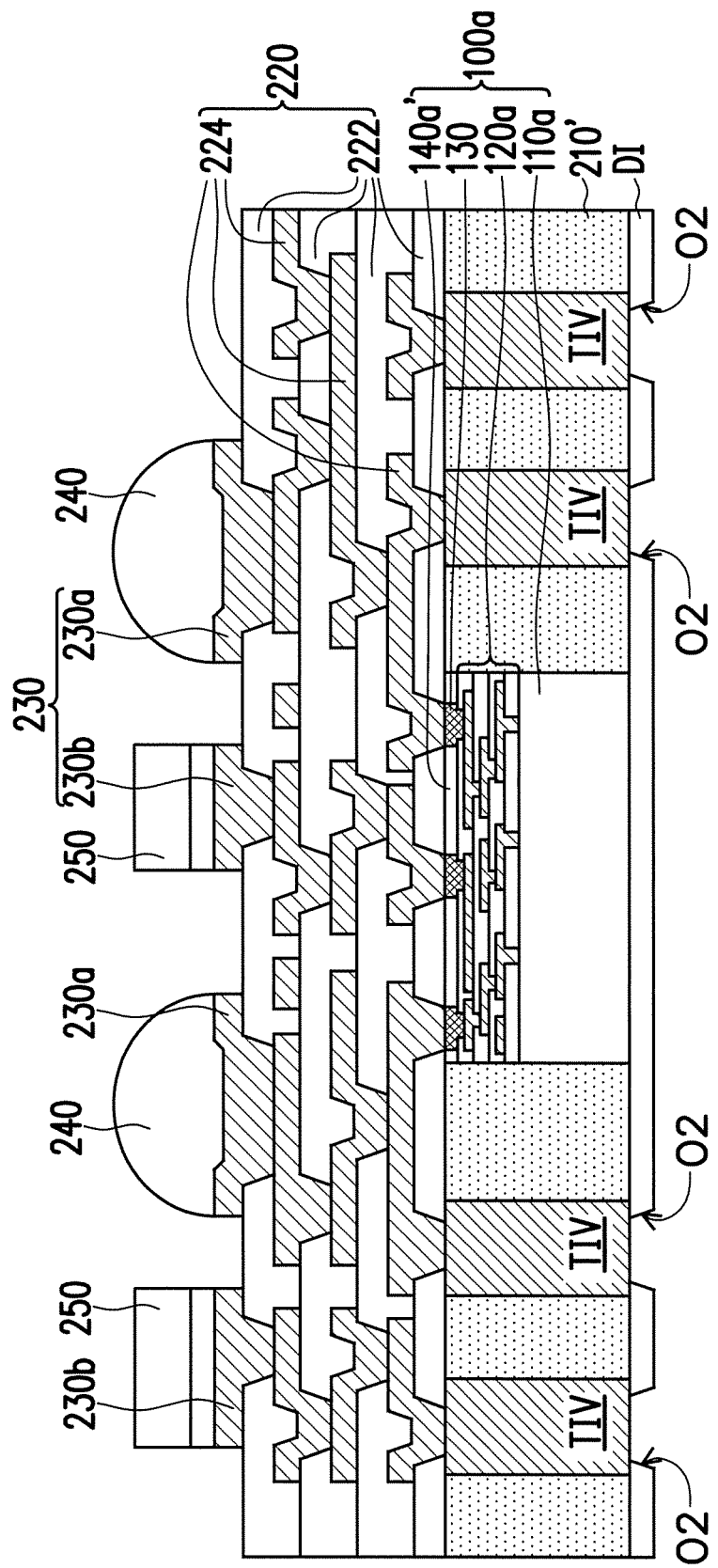

As shown in FIG. 12, the inter-dielectric layer DI is then patterned such that a plurality of contact openings O2 are formed to expose the bottom surfaces of the conductive through insulator vias TIV. The number and position of the contact openings O2 are corresponding to the number of the conductive through insulator vias TIV. In some embodiments, the contact openings O2 of the inter-dielectric layer DI are formed by a laser drilling process or other suitable patterning processes. In some alternative embodiments, the inter-dielectric layer DI may be entirely removed from the bottom surface of the insulating encapsulation 210' so as to expose the bottom surfaces of the conductive through insulator vias TIV.

Figure 13:
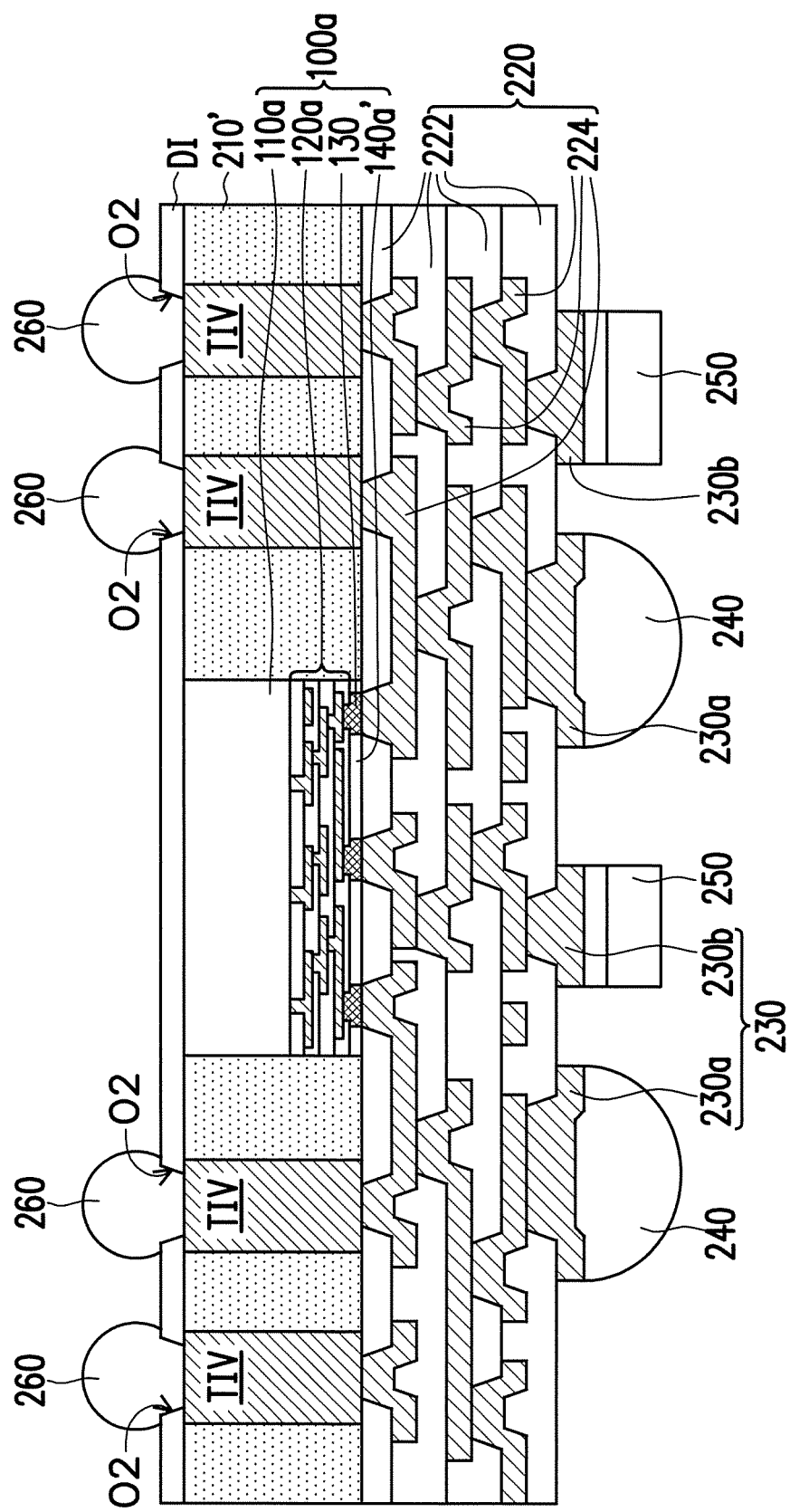

Referring to FIG. 13, after the contact openings O2 are formed in the inter-dielectric layer DI, a plurality of conductive balls 260 are placed on the bottom surfaces of the conductive through insulator vias TIV that are exposed by the contact openings O2. And, the conductive balls 260 are, for example, reflowed to bond with the bottom surfaces of the conductive through insulator vias TIV. As shown in FIG. 13, after the conductive balls 230 and the conductive balls 260 are formed, an integrated fan-out package of the integrated circuit 100 having dual-side terminal design (i.e. the conductive balls 240 and 260) is accomplished.

Figure 14:
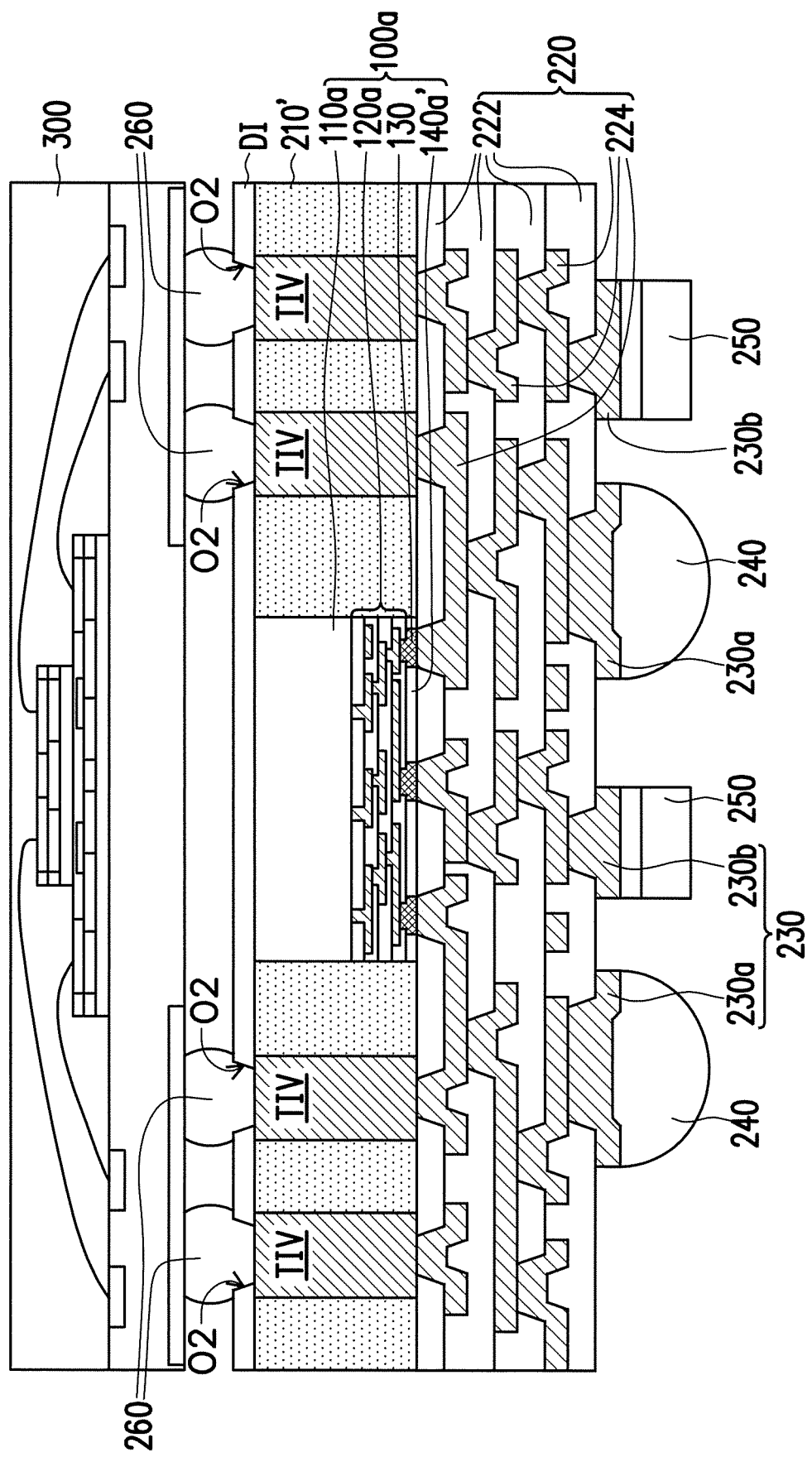
FIG. 14 is a cross-sectional view illustrating a package-on-package (POP) structure in accordance with some embodiments of the present disclosure.

FIG. 14 is a cross-sectional view illustrating a package-on-package (POP) structure in accordance with some embodiments of the present disclosure. Referring to FIG. 14, another package 300 is then provided. The package 300 is, for example, a memory device or other suitable semiconductor devices. The package 300 is stacked over and is electrically connected to the integrated fan-out package illustrated in FIG. 13 through the conductive balls 260 such that a package-on-package (POP) structure is fabricated. In some embodiments, the package-on-package (POP) structure may further include an underfill (not shown) disposed between the package 300 and the integrated fan-out package illustrated in FIG. 13. The underfill may encapsulate the conductive balls 260 to enhance the reliability and durability of the package-on-package (POP) structure.

Figure 15:
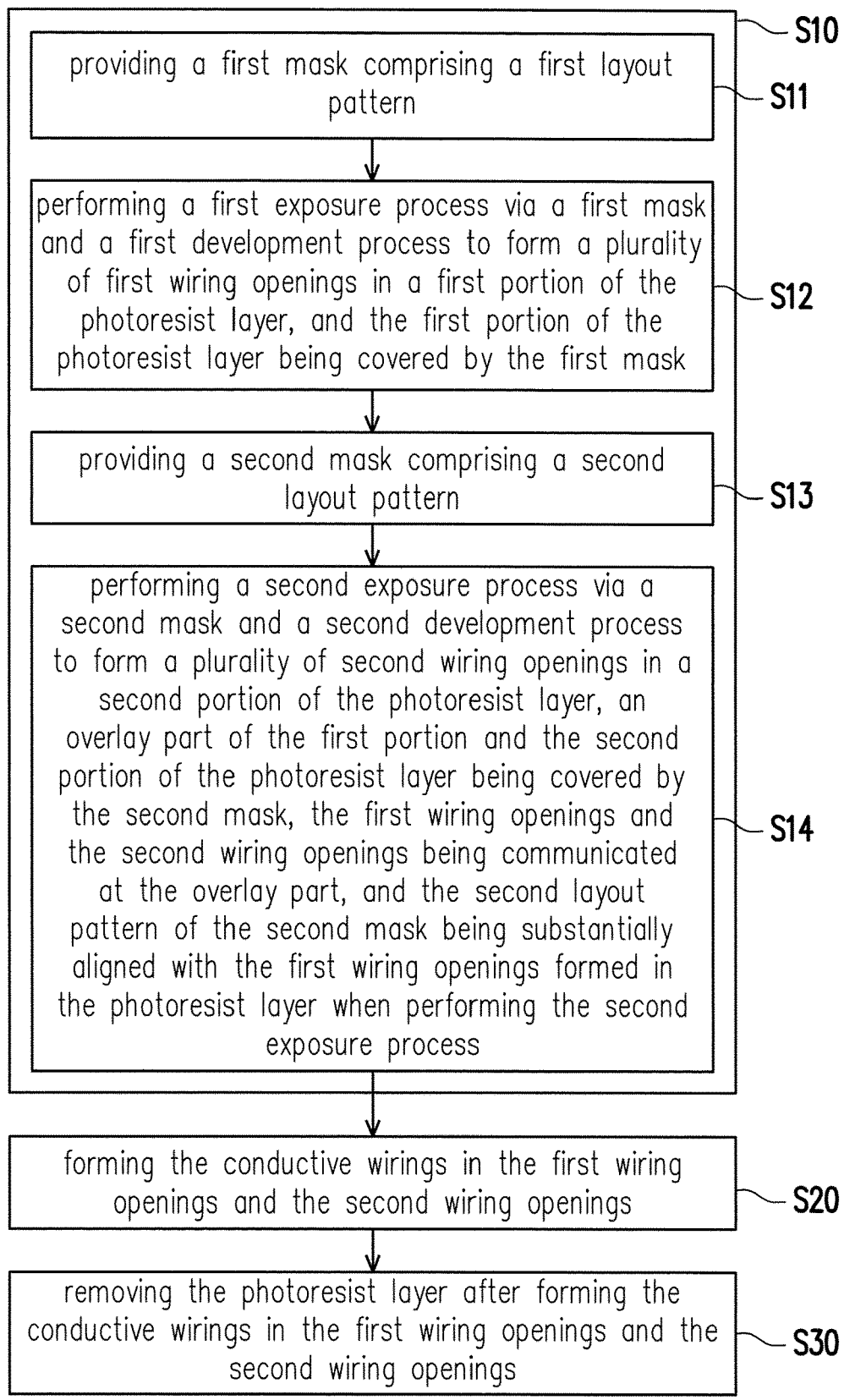
FIG. 15 schematically illustrate a process flow for fabricating conductive wirings in accordance with some embodiments of the present disclosure.

FIG. 15 schematically illustrate a process flow for fabricating conductive wirings in accordance with some embodiments of the present disclosure; FIG. 16A through FIG. 16F schematically illustrate a process flow for fabricating conductive wirings (i.e. the redistribution conductive layers 224) in the redistribution circuit structure 220 in accordance with some embodiments of the present disclosure; FIG. 17A schematically illustrates top views of the first mask M1 shown in FIG. 16A and the overlay portion OL shown in FIG. 16B in accordance with some embodiments of the present disclosure; FIG. 17B schematically illustrates top views of the second mask M2 shown in FIG. 16C and the overlay portion OL shown in FIG. 16D in accordance with some embodiments of the present disclosure; and FIG. 17C schematically illustrates a top view of the overlay portion OL shown in FIG. 16E in accordance with some embodiments of the present disclosure.

Referring to FIG. 15 and FIG. 16A through FIG. 16F, in some embodiments, a method for fabricating conductive wirings (shown in FIG. 16F) may include patterning a photoresist layer PR (step S10) and forming the conductive wirings in the photoresist layer PR (step S20). In some alternative embodiments, the method for fabricating the conductive wirings may further include removing the photoresist layer PR after forming the conductive wirings in photoresist layer PR (step S30). It is noted that the step S30 is optionally in the present disclosure. As shown in FIG. 15, a multi-step exposure and development process for patterning the photoresist layer PR (i.e. step S10) is performed and may include the following steps (i.e. steps S11, S12, S13 and S14).

Figure 16A:
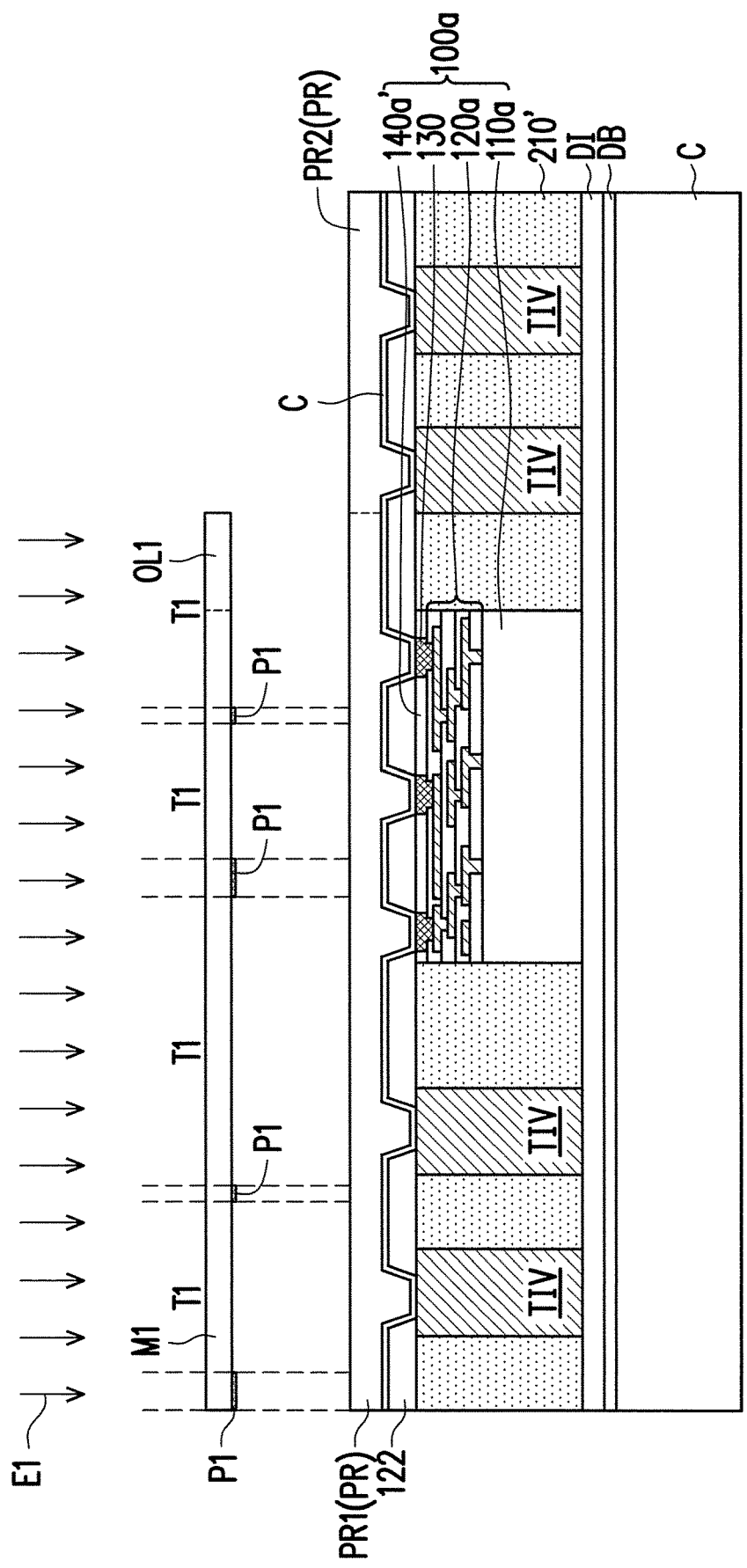
FIG. 16A through FIG. 16F schematically illustrate a process flow for fabricating conductive wirings (i.e. the redistribution conductive layers 224) in the redistribution circuit structure 220 in accordance with some embodiments of the present disclosure.
Figures 17A, 17B:
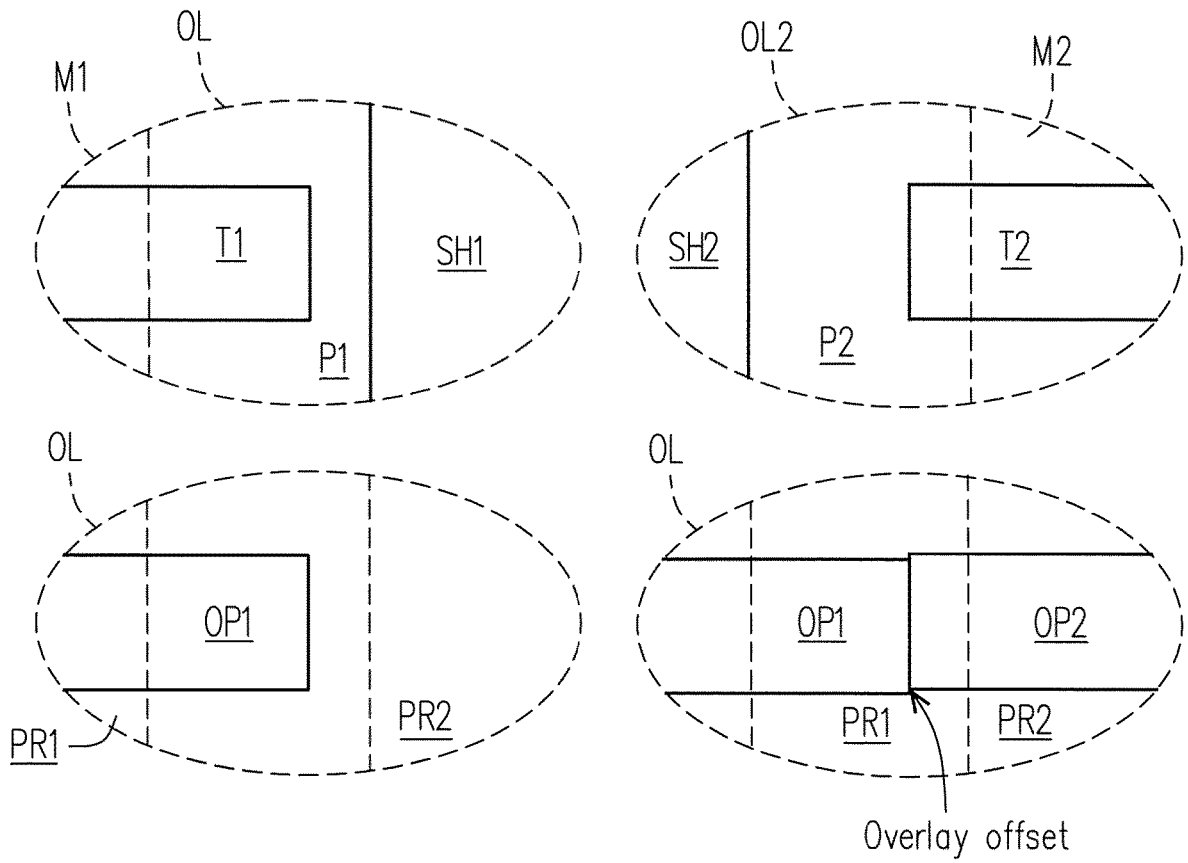
FIG. 17A schematically illustrates top views of the first mask M1 shown in FIG. 16A and the overlay portion OL shown in FIG. 16B in accordance with some embodiments of the present disclosure.
FIG. 17B schematically illustrates top views of the second mask M2 shown in FIG. 16C and the overlay portion OL shown in FIG. 16D in accordance with some embodiments of the present disclosure.
Figure 17C:
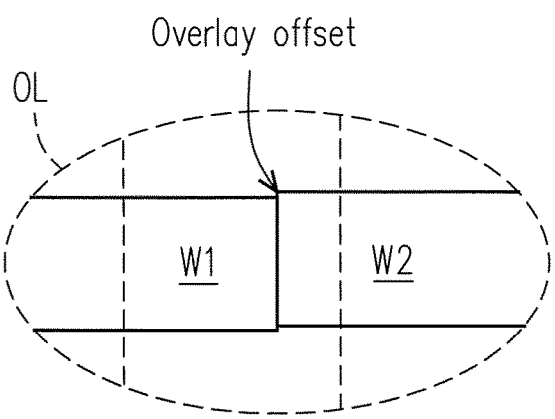
FIG. 17C schematically illustrates a top view of the overlay portion OL shown in FIG. 16E in accordance with some embodiments of the present disclosure.

As shown FIG. 16A, in some embodiments, a conductive layer C is formed on the at least one integrated circuit component 100a and the insulating encapsulation 210'. Before forming the conductive layer C, an inter-dielectric layer 122 may be formed on the at least one integrated circuit component 100a and the insulating encapsulation 210'. The inter-dielectric layer 122 may include a plurality of contact openings which expose the top surfaces of the conductive pillars 130 and the conductive through insulator vias TIV. After the conductive layer C is formed, a photoresist layer PR is formed on the conductive layer C. In some embodiments, the conductive layer C serves as a seed layer and is formed by a sputter process while the photoresist layer PR is formed on the conductive layer C by a spin coating process, for example.

Figure 16B:
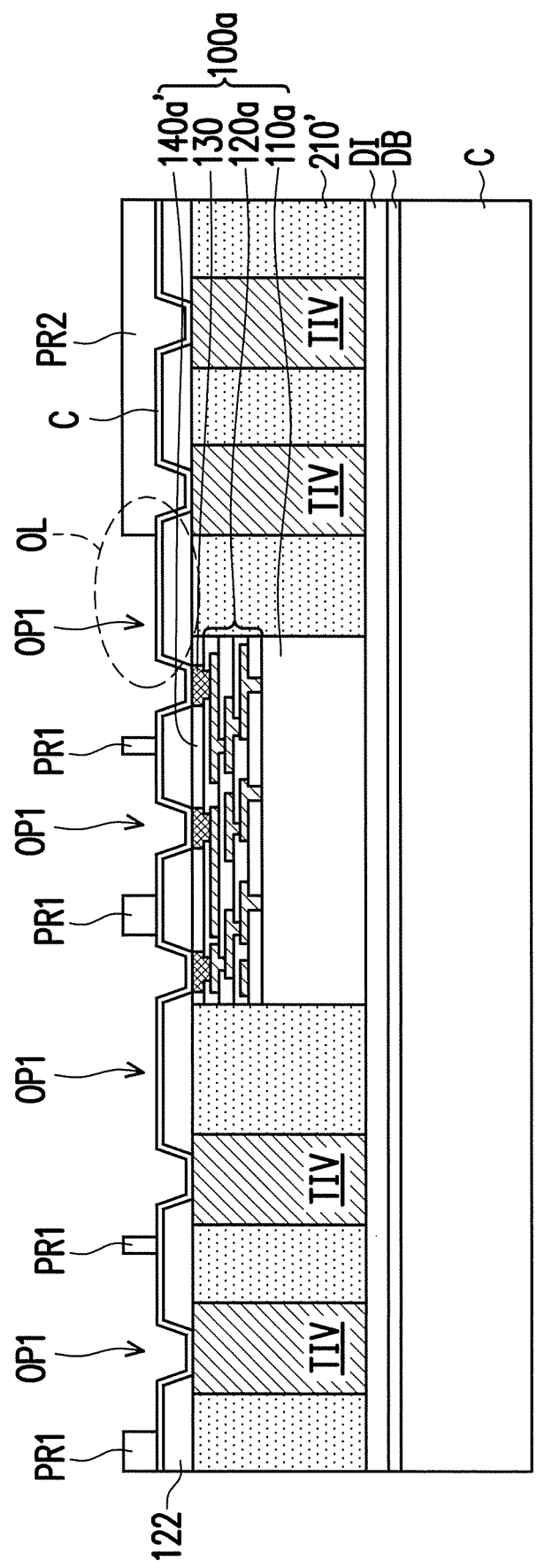
Figure 16C:
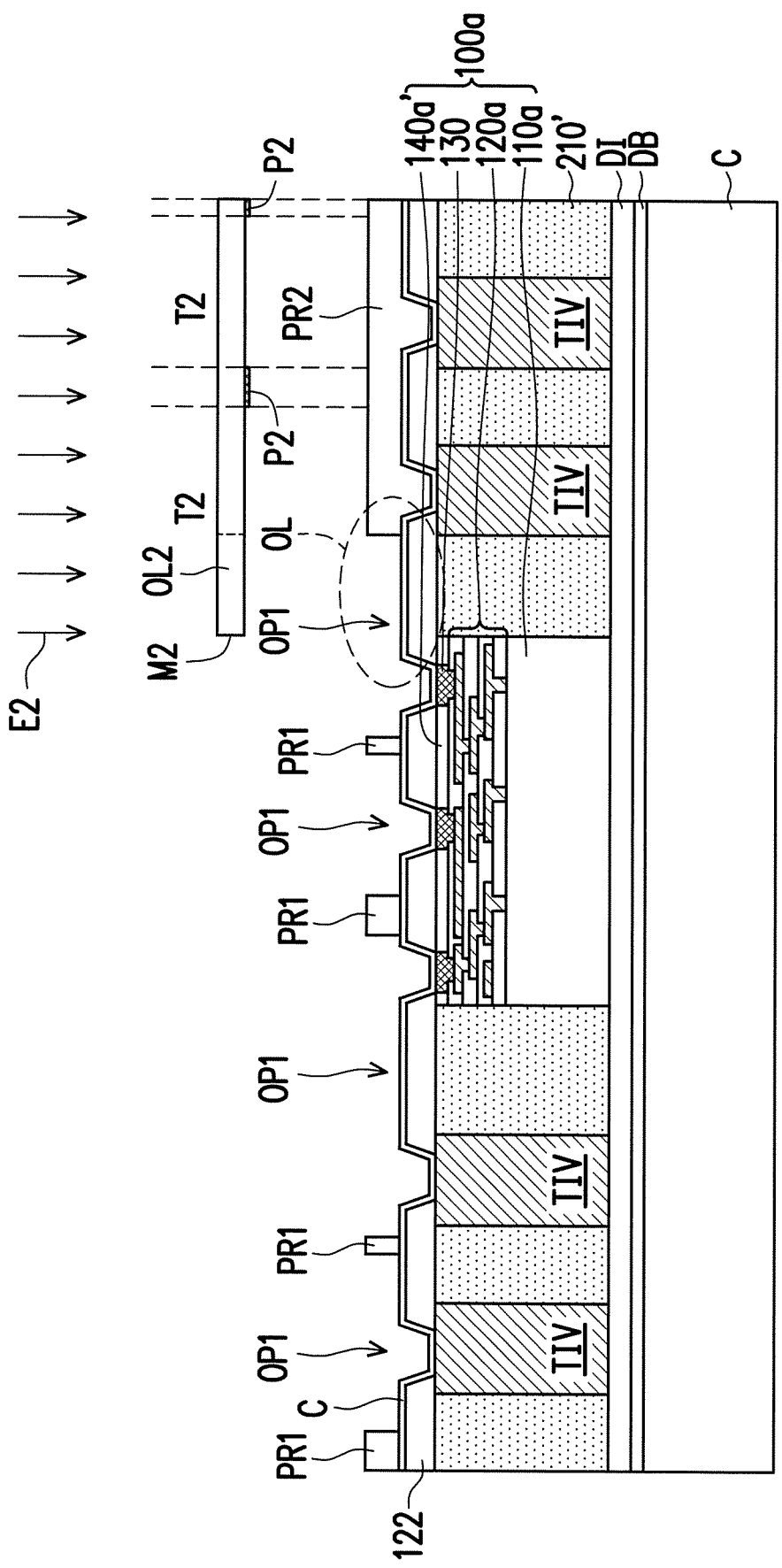

As shown in FIG. 15, FIG. 16A, FIG. 16B and FIG. 17A, a first mask M1 including a first layout pattern P1 is provided (step S11). The first mask M1 covers a first portion PR1 (e.g., the left portion) of the photoresist layer PR, but the first mask M1 does not cover a second portion PR2 (e.g., the right portion) of the photoresist layer PR. The first mask M1 includes a first overlay area OL1. In some embodiments, the first layout pattern P1 of the first mask M1 may include a first light-shielding pattern having a plurality of first light-transmissive regions T1. Then, a first exposure process E1 via a first mask M1 and a first development process (step S12) are performed so as to form a plurality of first wiring openings OP1 in the first portion PR1 of the photoresist layer PR. Through the shielding of the first layout pattern P1 of the first mask M1, the photoresist layer PR is partially patterned and the first wiring openings OP1 corresponding to the first light-transmissive regions T1 may be formed in the first portion PR1 of the photoresist layer PR. As shown in FIG. 16B, the conductive layer C is partially exposed by the first wiring openings OP1 formed in the first portion PR1 of the photoresist layer PR.

In some embodiments, in order to prevent the second portion PR2 of the photoresist layer PR from being exposed, the first mask M1 may be fixed by a light-shielding member SH1 (shown in FIG. 17A) and the light-shielding member SH1 may shield the second portion PR2 of the photoresist layer PR. In some alternative embodiments, in order to prevent the second portion PR2 of the photoresist layer PR from being exposed, a light-shielding member SH1 (shown in FIG. 17A) may be provided to shield the second portion PR2 of the photoresist layer PR and the first mask M1 may not be fixed by the light-shielding member SH1. In another embodiment, through proper control of the light source used in the first exposure process E1, unwanted exposure of the second portion PR2 of the photoresist layer PR may be prevented. For example, the light provided by the light source used in the first exposure process E1 may be electrically controlled (e.g., only a portion area of the light source which correspond to the overlay portion OL and the first portion PR1 of the photoresist layer PR is turned on) or optically controlled (e.g., a portion area of the light source which correspond to the second portion PR2 of the photoresist layer PR is shielded by a light-shielding member) so as to locally irradiate on the overlay portion OL and the first portion PR1 of the photoresist layer PR. Other suitable manners for preventing the second portion PR2 of the photoresist layer PR from being exposed may be also used in the present disclosure.

Figure 16D:
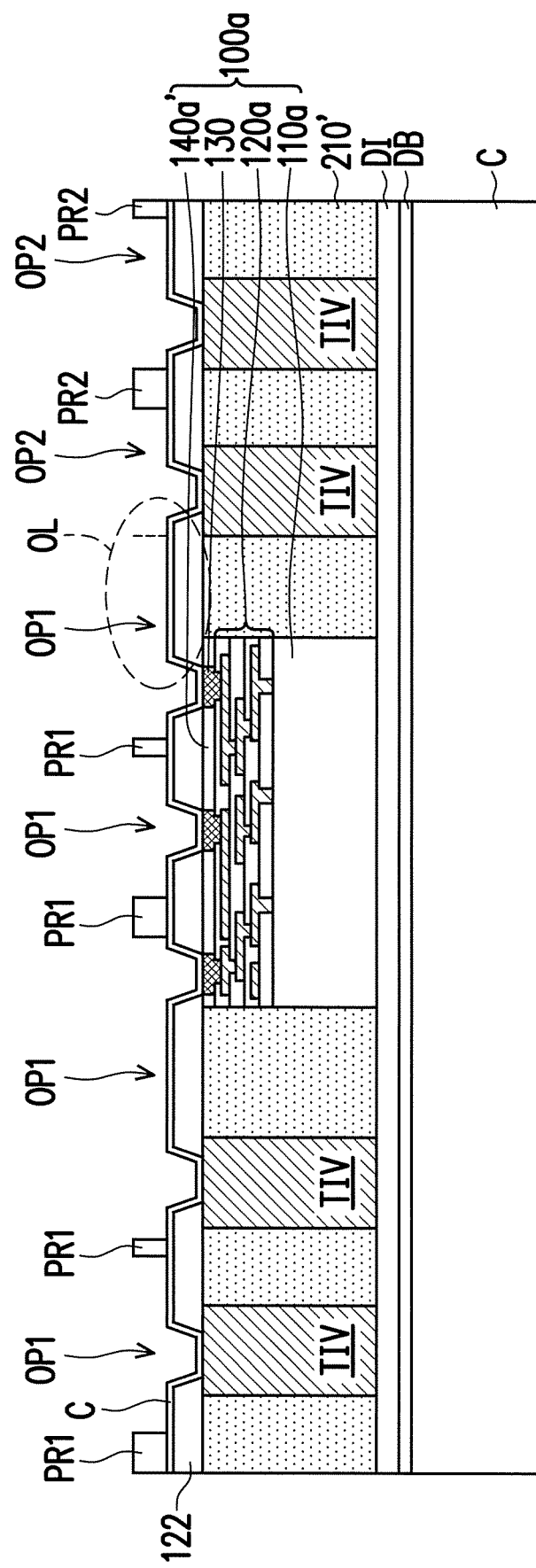

As shown in FIG. 15, FIG. 16C, FIG. 16D and FIG. 17B, a second mask M2 including a second layout pattern P2 is provided (step S13). The second mask M2 covers an overlay portion OL and the second portion PR2 (e.g., the right portion) of the photoresist layer PR. The overlay portion OL is an area which is sequentially covered by the first mask M1 (shown in FIG. 16A) and the second mask M2. In other words, the overlay portion OL is a part of the first portion PR1 and is corresponding to the first overlay area OL1 of the first mask M1. Except for the overlay portion OL, the first portion PR1 (e.g., the left portion) of the photoresist layer PR is not covered by the second mask M2. The second mask M2 includes a second overlay area OL2 and the second overlay area OL2 covers and corresponds to the overlay portion OL. In some embodiments, the second layout pattern P2 of the second mask M1 may include a second light-shielding pattern having a plurality of second light-transmissive regions T2. Then, a second exposure process E2 via a second mask M2 and a second development process (step S14) are performed so as to form a plurality of second wiring openings OP2 in the second portion PR2 of the photoresist layer PR. The second layout pattern P2 of the second mask M2 is substantially aligned with the first wiring openings OP1 formed in the overlay portion OL of the photoresist layer PR when performing the second exposure process E2. In other words, the second light-transmissive regions T2 are substantially aligned with the first wiring openings OP1 formed in the overlay portion OL of the photoresist layer PR when performing the second exposure process E2. Through the shielding of the second layout pattern P2 of the second mask M2, the photoresist layer PR is further patterned and the second wiring openings OP2 corresponding to the second light-transmissive regions T2 may be formed in the second portion PR2 of the photoresist layer PR. As shown in FIG. 16D, the conductive layer C is partially exposed by the first wiring openings OP1 and the second wiring openings OP2 formed in the photoresist layer PR.

In some embodiments, in order to prevent the first portion PR1 uncovered by the second mask M2 from being exposed, the second mask M2 may be fixed by a light-shielding member SH2 (shown in FIG. 17B) and the light-shielding member SH2 may shield the first portion PR1 uncovered by the second mask M2. In some alternative embodiments, in order to prevent the first portion PR1 uncovered by the second mask M2 from being exposed, a light-shielding member SH2 (shown in FIG. 17B) may be provided to shield the first portion PR1 uncovered by the second mask M2 and the second mask M2 may not be fixed by the light-shielding member SH2. In another embodiment, through proper control of the light source used in the second exposure process E2, unwanted exposure of the first portion PR1 uncovered by the second mask M2 may be prevented. For example, the light provided by the light source used in the second exposure process E2 may be electrically controlled (e.g., only a portion area of the light source which correspond to the overlay portion OL and the second portion PR2 of the photoresist layer PR is turned on) or optically controlled (e.g., a portion area of the light source which correspond to the first portion PR1 of the photoresist layer PR is shielded by a light-shielding member) so as to locally irradiate on the overlay portion OL and the second portion PR2 of the photoresist layer PR. Other suitable manners for preventing unwanted exposure of the first portion PR1 of the photoresist layer PR may be also used in the present disclosure.

After performing the second exposure process E2 and the second development process, the first wiring openings OP1 and the second wiring openings OP2 formed in the photoresist layer PR are communicated at the overlay portion OL. As shown in FIG. 17B, an overlay offset may occur between the first wiring openings OP1 and the second wiring openings OP2 due to alignment shift (i.e. overlay shift).

Figure 16E:
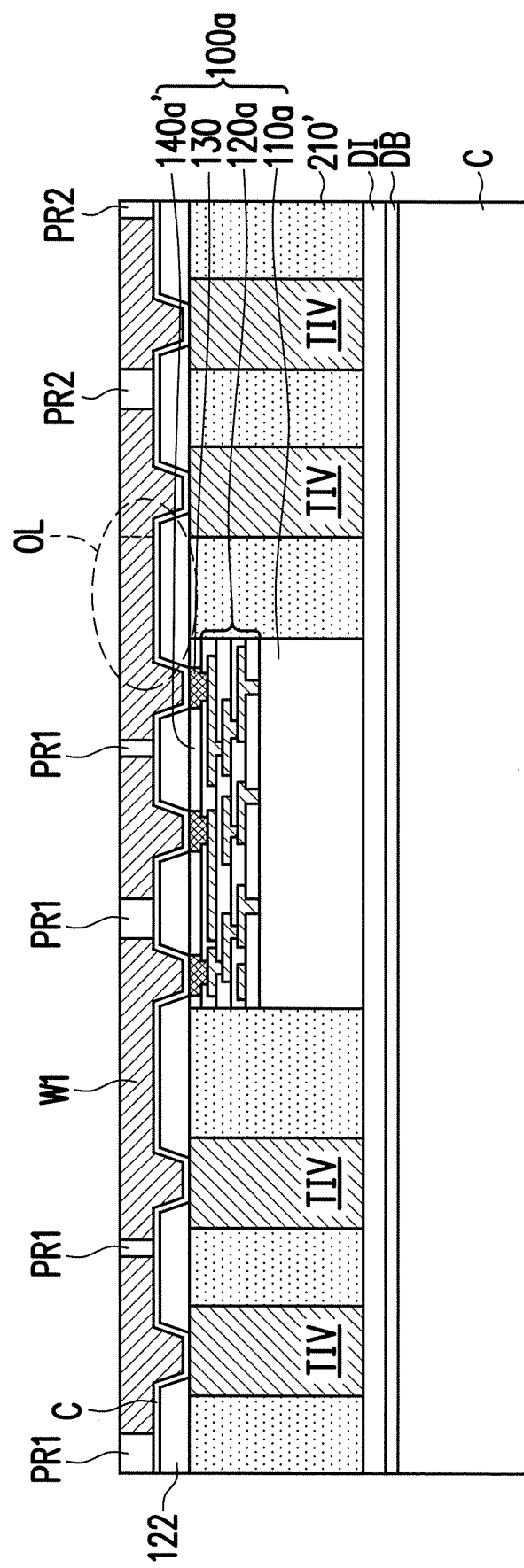

As shown in FIG. 15, FIG. 16E and FIG. 17B, after forming the first wiring openings OP1 and the second wiring openings OP2, a plurality of conductive wirings are formed in the first wiring openings OP1 and the second wiring openings OP2 through, for example, a plating process. In other words, the conductive wirings are formed (e.g., plated) on the conductive layer C which is partially exposed by the first wiring openings OP1 and the second wiring openings OP2. In some embodiments, the conductive wirings each including a first conductive segment W1 and a second conductive segment W2 are formed in the first wiring openings OP1 and the second wiring openings OP2 of the photoresist layer PR (S20). In other words, the first conductive segments W1 of the conductive wirings are formed in the first wiring openings OP1 and the second conductive segments W2 of the conductive wirings are formed in the second wiring openings OP2.

Figure 16F:
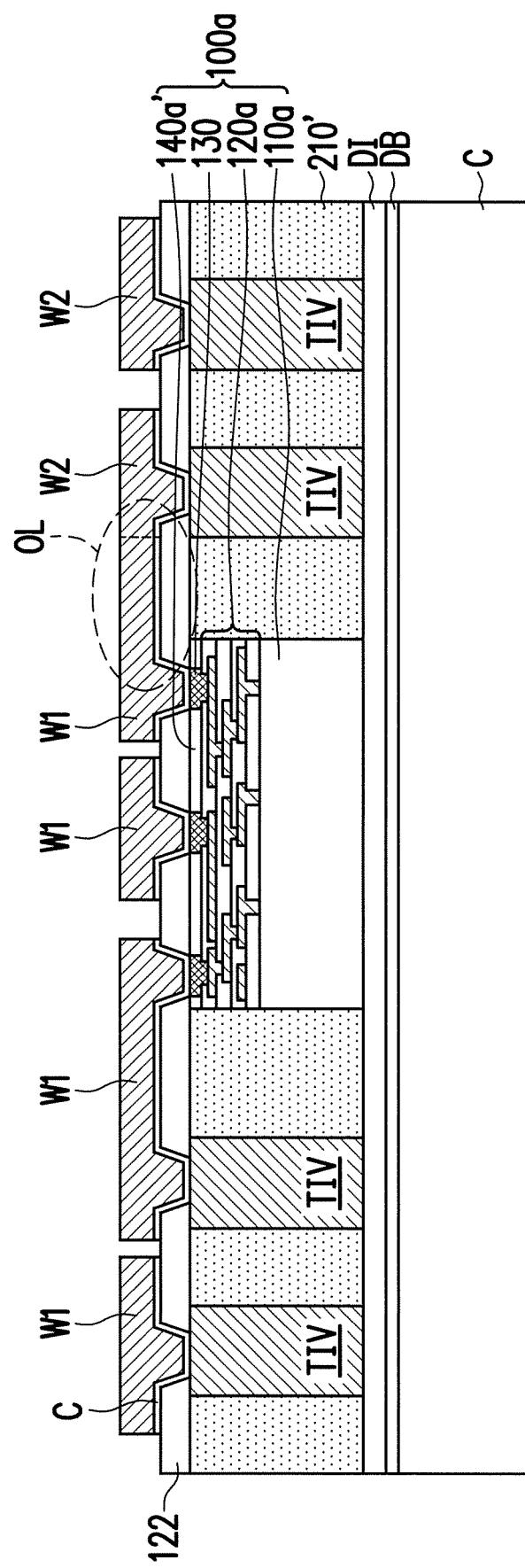

As shown in FIG. 16F and FIG. 17C, after forming the conductive wirings in the first wiring openings OP1 and second wiring openings OP2 of the photoresist layer PR (step S30), the first portion PR1 and the second portion PR2 of the photoresist layer PR are removed. After removing the first portion PR1 and the second portion PR2, portions of the conductive layer C uncovered by the first conductive segments W1 and the second conductive segments W2 are removed through, for example, an etching process until the inter-dielectric layer 122 is exposed. In some alternative embodiments, the formation and patterning processes of the conductive layer C may be omitted. As shown in FIG. 17C, in some embodiment, the first conductive segments W1 and the second conductive segments W2 are connected at the overlay portion OL, and an overlay offset may occur between the first conductive segments W1 and the second conductive segments W2 due to alignment shift (i.e. overlay shift). It is noted that, alignment shift of masks M1 and/or M2 may be easily judged through the above-mentioned overlay offset.

Figures 18A, 18B:
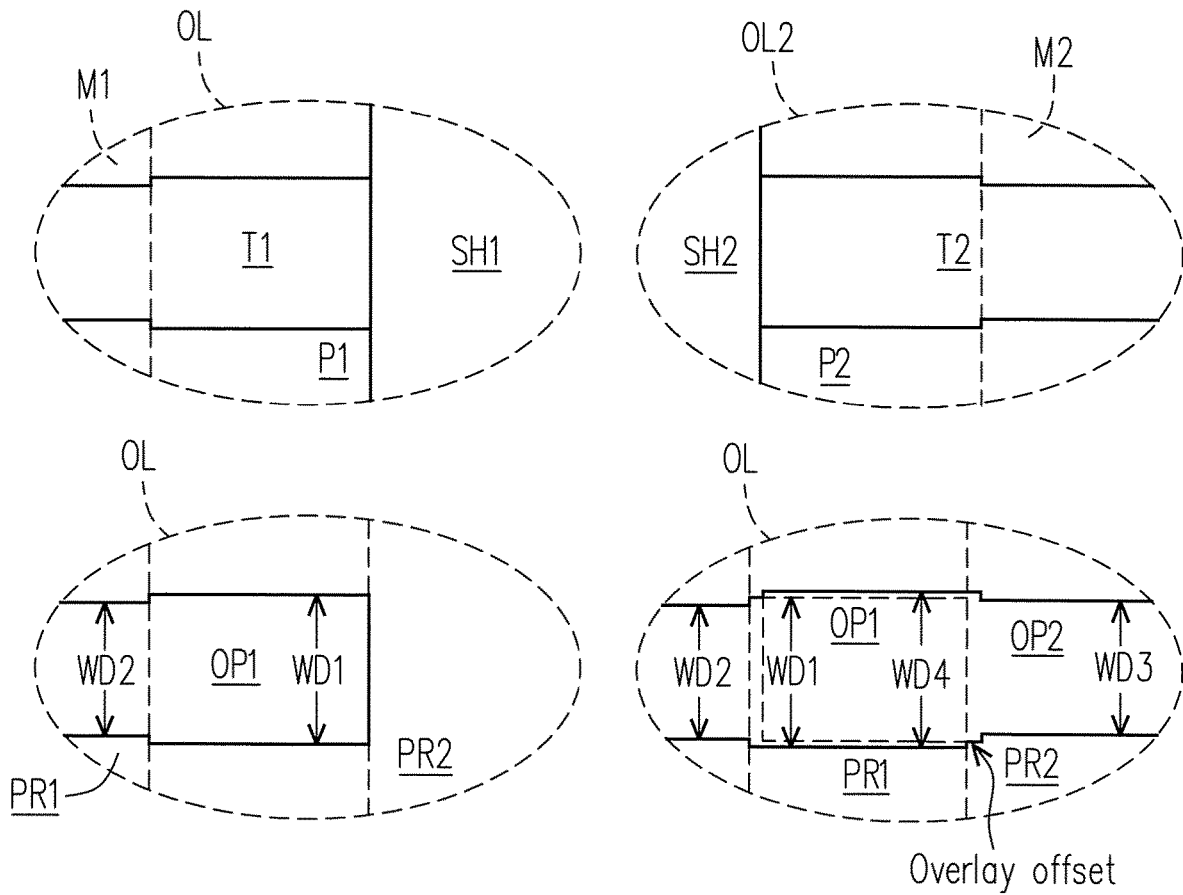
FIG. 18A schematically illustrates top views of the first mask M1 shown in FIG. 16A and the overlay portion OL shown in FIG. 16B in accordance with some alternative embodiments of the present disclosure.
FIG. 18B schematically illustrates top views of the second mask M2 shown in FIG. 16C and the overlay portion OL shown in FIG. 16D in accordance with some alternative embodiments of the present disclosure.

FIG. 18A schematically illustrates top views of the first mask M1 shown in FIG. 16A and the overlay portion OL shown in FIG. 16B in accordance with some alternative embodiments of the present disclosure; FIG. 18B schematically illustrates top views of the second mask M2 shown in FIG. 16C and the overlay portion OL shown in FIG. 16D in accordance with some alternative embodiments of the present disclosure; and FIG. 18C schematically illustrates a top view of the overlay portion OL shown in FIG. 16E in accordance with some alternative embodiments of the present disclosure.

Figure 18C:
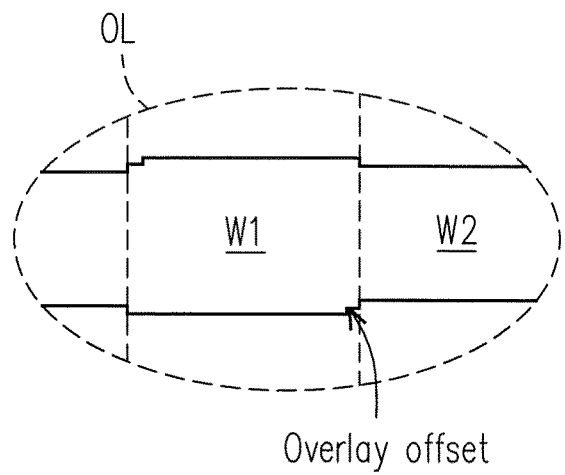
FIG. 18C schematically illustrates a top view of the overlay portion OL shown in FIG. 16E in accordance with some alternative embodiments of the present disclosure.

Referring to FIG. 18A through FIG. 18C, a width WD1 of the first wiring openings OP1 formed in the overlay portion OL is greater than a width WD2 of the first wiring openings OP1 formed in the first portion PR1 which is not covered by the second mask M2. For example, a ration of the width WD1 and the width WD2 (i.e. WD1/WD2) may range from about 1.2 to about 2. In some embodiments, the width WD2 of the first wiring openings OP1 formed in the overlay portion OL is substantially equal to a width WD3 of the second wiring openings OP2 formed in the second portion PR2. Due to the overlay shift, the width WD1 of the first wiring openings OP1 may be increased to WD4. It is noted that, alignment shift of masks M1 and/or M2 may be easily judged through the above-mentioned overlay offset.

Figure 19:
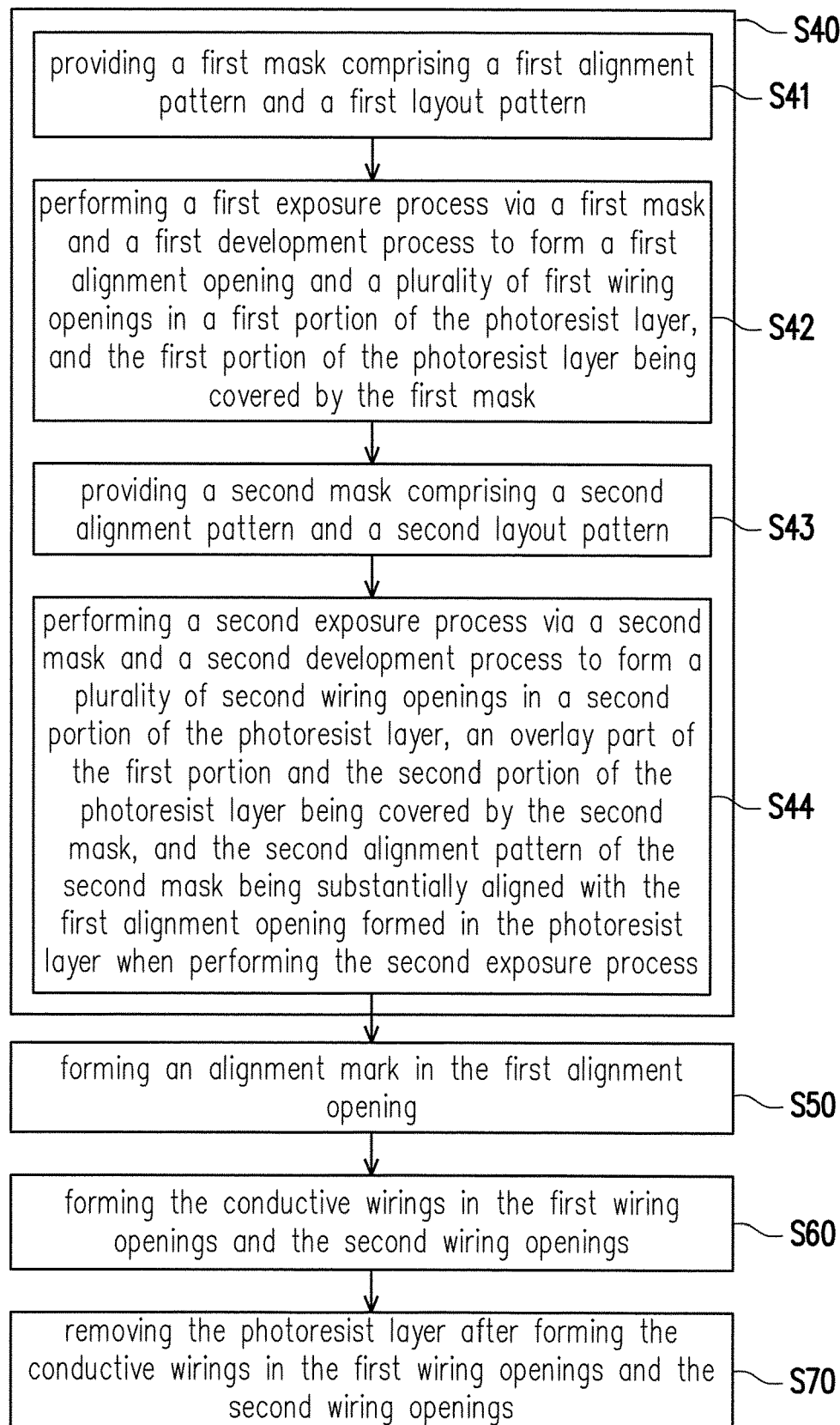
FIG. 19 schematically illustrate another process flow for fabricating conductive wirings in accordance with some embodiments of the present disclosure.
Figure 20C:
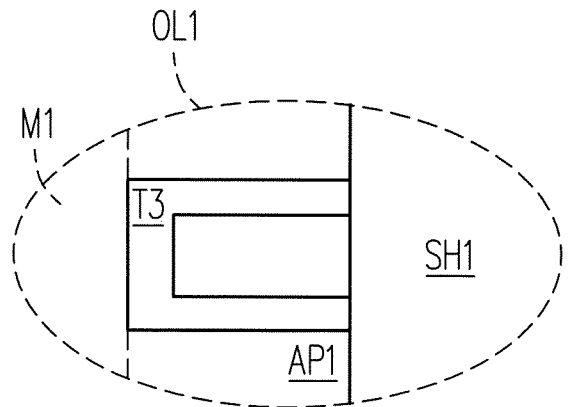
FIG. 20C schematically illustrates a top view of the overlay portion OL shown in FIG. 16E in accordance with some alternative embodiments of the present disclosure.
Figure 20C:
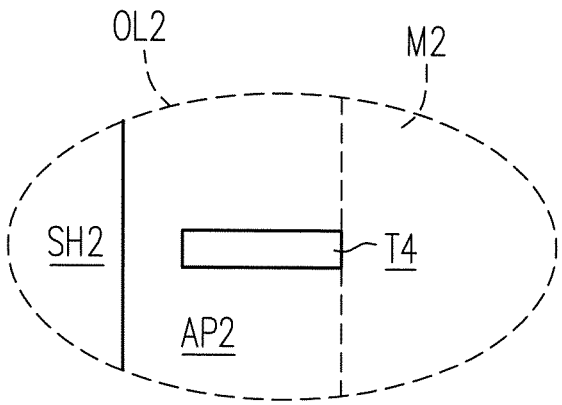
Figure 20C:
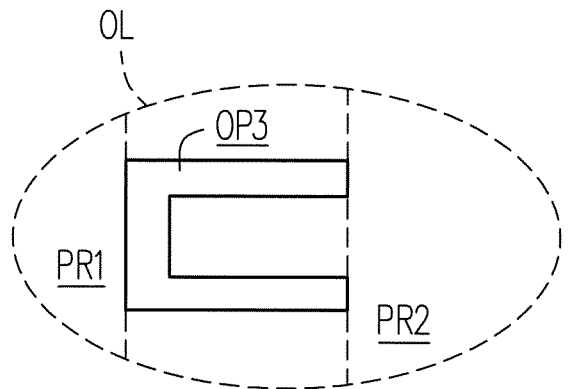
Figure 20C:
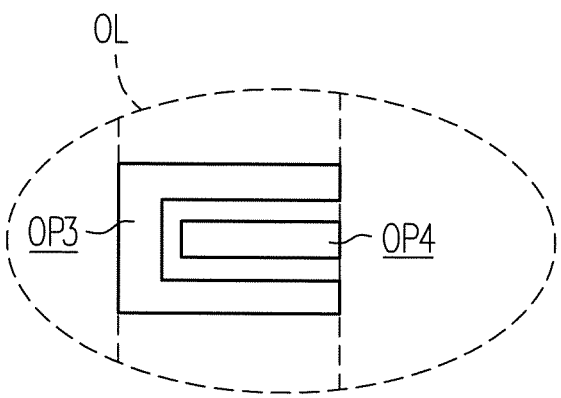
Figure 20C:
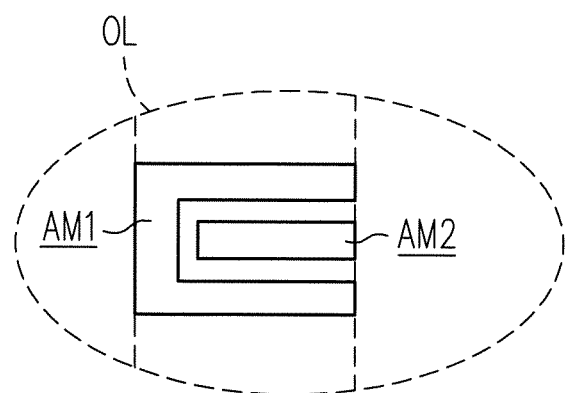

FIG. 19 schematically illustrate another process flow for fabricating conductive wirings in accordance with some embodiments of the present disclosure; FIG. 20A schematically illustrates top views of the first mask M1 shown in FIG. 16A and the overlay portion OL shown in FIG. 16B in accordance with some alternative embodiments of the present disclosure; FIG. 20B schematically illustrates top views of the second mask M2 shown in FIG. 16C and the overlay portion OL shown in FIG. 16D in accordance with some alternative embodiments of the present disclosure; and FIG. 20C schematically illustrates a top view of the overlay portion OL shown in FIG. 16E in accordance with some alternative embodiments of the present disclosure.

Referring to FIG. 19, in some embodiments, a method for fabricating conductive wirings including patterning a photoresist layer (S40), forming an alignment mark in the photoresist layer (S50), and forming the conductive wirings in the photoresist layer (S60) is provided. In some embodiments, the steps of forming an alignment mark in the photoresist layer (S50) and forming the conductive wirings in the photoresist layer (S60) may be performed simultaneously or sequentially. For example, the alignment mark may be formed before or after forming the conductive wirings in the photoresist layer. Alternatively, the alignment mark and the conductive wirings may be formed by a same process (e.g. a plating process). In some alternative embodiments, the method for fabricating the conductive wirings may further include removing the photoresist layer after forming the conductive wirings in photoresist layer (step S70). It is noted that the step S70 is optionally in the present disclosure.

As shown in FIG. 19, a multi-step exposure and development process for patterning the photoresist layer (i.e. step S40) is performed and may include the following steps (i.e. steps S41, S42, S43 and S44). A first mask including a first alignment pattern and a first layout pattern is provided (step S41). A first exposure process via a first mask and a first development process are performed so as to form a first alignment opening and a plurality of first wiring openings in a first portion of the photoresist layer, wherein the first portion of the photoresist layer is covered by the first mask (step S42). A second mask including a second alignment pattern and a second layout pattern is provided (step S43). A second exposure process via a second mask and a second development process are performed so as to form a plurality of second wiring openings in a second portion of the photoresist layer, wherein an overlay portion of the first portion and the second portion of the photoresist layer are covered by the second mask, and the second alignment pattern of the second mask is substantially aligned with the first alignment opening formed in the photoresist layer when performing the second exposure process (step S44).

The method for fabricating the conductive wirings illustrated in FIG. 19 is similar with that illustrated in FIG. 15 except that fabricating process of the conductive wirings illustrated in FIG. 17 further include fabrication of the alignment mark (i.e. steps S40 and S50). Therefore, the detail descriptions regarding to the conductive wirings are omitted.

Referring to FIG. 19 and FIG. 20A, a first mask M1 including a first alignment pattern AP1 and a first layout pattern P1 (shown in FIG. 17A or FIG. 18A) is provided (step S41). On the first mask M1, the first alignment pattern AP1 may be connected to the first layout pattern P1, for example. The first mask M1 covers a first portion PR1 (e.g., the left portion) of the photoresist layer PR, but the first mask M1 does not cover a second portion PR2 (e.g., the right portion) of the photoresist layer PR. The first mask M1 includes a first overlay area OL1 and the first alignment pattern AP1 is distributed in the first overlay area OL1. In some embodiments, the first alignment pattern AP1 of the first mask M1 may include a first light-shielding pattern having a plurality of third light-transmissive regions T3. Then, a first exposure process via a first mask M1 and a first development process (step S42) are performed so as to form a first alignment opening OP3 and a plurality of first wiring openings OP1 (shown in FIG. 17A or FIG. 18A) in the first portion PR1 of the photoresist layer PR. Through the shielding of the first alignment pattern AP1 and the first layout pattern P1 of the first mask M1, the photoresist layer PR is partially patterned such that the first alignment opening OP3 corresponding to the third light-transmissive regions T3 and the first wiring openings OP1 corresponding to the first light-transmissive regions T1 may be formed in the first portion PR1 of the photoresist layer PR. In some embodiments, the conductive layer C (shown in FIG. 16E) is partially exposed by the first alignment opening OP3 and the first wiring openings OP1 formed in the first portion PR1 of the photoresist layer PR.

Referring to FIG. 19 and FIG. 20A, a second mask M2 including a second alignment pattern AP2 and a second layout pattern P2 is provided (step S43). On the second mask M2, the second alignment pattern AP2 may be connected to the second layout pattern P2, for example. The second mask M2 covers an overlay portion OL and the second portion PR2 (e.g., the right portion) of the photoresist layer PR. The overlay portion OL is an area which is sequentially covered by the first mask M1 (shown in FIG. 16A) and the second mask M2. In other words, the overlay portion OL is a part of the first portion PR1 and is corresponding to the first overlay area OL1 of the first mask M1. Except for the overlay portion OL, the first portion PR1 (e.g., the left portion) of the photoresist layer PR is not covered by the second mask M2. The second mask M2 includes a second overlay area OL2 and the second overlay area OL2 corresponds to the overlay portion OL. The second alignment pattern AP2 is distributed in the second overlay area OL2. In some embodiments, the second alignment pattern AP2 of the second mask M1 may include a fourth light-shielding pattern having a plurality of fourth light-transmissive regions T4. Then, a second exposure process via a second mask M2 and a second development process (step S44) are performed so as to form a plurality of second wiring openings OP2 in the overlay portion OL of the photoresist layer PR. In some embodiments, a second alignment opening OP4 aligned with the first alignment opening OP3 may be further formed in the photoresist layer PR after the second exposure process and the second development process are performed. The second alignment pattern AP2 of the second mask M2 is substantially aligned with or corresponding to the first alignment openings OP3 formed in overlay portion OL of the photoresist layer PR when performing the second exposure process. In other words, the fourth light-transmissive regions T4 are substantially aligned with the first alignment openings OP3 formed in overlay portion OL of the photoresist layer PR when performing the second exposure process. Through the shielding of the second alignment pattern AP2 of the second mask M2, the photoresist layer PR is patterned and the second alignment openings OP4 corresponding to the fourth light-transmissive regions T4 may be formed in the overlay portion OL of the photoresist layer PR. As shown in FIG. 20B, the conductive layer C (shown in FIG. 16E) is partially exposed by the first alignment openings OP3 and the second alignment openings OP4 formed in the photoresist layer PR.

After performing the second exposure process and the second development process, the first alignment openings OP3 and the second alignment openings OP4 formed in the photoresist layer PR are aligned with each other at the overlay portion OL. As shown in FIG. 20B, the second alignment opening OP4 may be spaced apart from the first alignment opening OP3. Furthermore, an overlay offset may occur between the first wiring openings OP1 and the second wiring openings OP2 due to alignment shift (i.e. overlay shift).

As shown in FIG. 19, FIG. 20B and FIG. 20C, after forming the first alignment openings OP3 and the second alignment openings OP4, at least one alignment mark (e.g., alignment marks AM1 and AM2) is formed in the first alignment openings OP3 and the second alignment openings OP4 through, for example, a plating process. In other words, the alignment marks AM1 and AM2 are formed (e.g., plated) on the conductive layer C (shown in FIG. 16E) which is partially exposed by the first alignment openings OP3 and the second alignment openings OP4. In some embodiments, the conductive wirings and the alignment marks AM1 and AM2 may be formed by the same plating process.

As shown in FIG. 20C, after forming the alignment marks AM1 and AM2 in first alignment openings OP3 and the second alignment openings OP4 of the photoresist layer PR (step S50), the first portion PR1 and the second portion PR2 of the photoresist layer PR are removed. After removing the first portion PR1 and the second portion PR2, portions of the conductive layer C (shown in FIG. 16E) uncovered by the alignment marks AM1 and AM2 are removed through, for example, an etching process until the inter-dielectric layer 122 is exposed. In some alternative embodiments, the formation and patterning processes of the conductive layer C (shown in FIG. 16E) may be omitted.

In some embodiment, the alignment mark AM1 has an alignment notch and the alignment mark AM2 extends into the alignment notch. In some alternative embodiment, the alignment mark AM2 has an alignment notch and the alignment mark AM1 extends into the alignment notch. The shape of the alignments marks AM1 and AM2 are not limited in the present disclosure. The alignment marks AM1 and AM2 are spaced apart from each other at the overlay portion OL, and an overlay offset may occur between the alignment marks AM1 and AM2 due to alignment shift (i.e. overlay shift). It is noted that, alignment shift of masks M1 and/or M2 may be easily judged by the distance between the alignment marks AM1 and AM2. The distance between the alignment marks AM1 and AM2 may be about 5 micrometers.

Although the above-mentioned fabrication processes is described to fabricate the redistribution conductive layers 224 in the redistribution circuit structure 220, the above-mentioned fabrication processes may also be utilized to fabricate the inter-dielectric layers 222 (shown in FIG. 9) in the redistribution circuit structure 220.

According to some embodiments, a method for fabricating conductive wirings including patterning a photoresist layer and forming the conductive wirings in the photoresist layer is provided. Patterning the photoresist layer including the following steps. A first mask including a first layout pattern is provided. A first exposure process via a first mask and a first development process are performed so as to form a plurality of first wiring openings in a first portion of the photoresist layer, wherein the first portion of the photoresist layer is covered by the first mask. A second mask comprising a second layout pattern is provided. A second exposure process via a second mask and a second development process are performed so as to form a plurality of second wiring openings in a second portion of the photoresist layer, wherein an overlay portion of the first portion and the second portion of the photoresist layer are covered by the second mask, the first wiring openings and the second wiring openings are communicated at the overlay portion, and the second layout pattern of the second mask is substantially aligned with the first wiring openings formed in the photoresist layer when performing the second exposure process. The conductive wirings are formed in the first wiring openings and the second wiring openings of the photoresist layer.

According to some alternative embodiments, a method for fabricating conductive wirings including patterning a photoresist layer, forming an alignment mark in the photoresist layer, and forming the conductive wirings in the photoresist layer is provided. Patterning the photoresist layer including the following steps. A first mask including a first alignment pattern and a first layout pattern is provided. A first exposure process via a first mask and a first development process are performed so as to form a first alignment opening and a plurality of first wiring openings in a first portion of the photoresist layer, wherein the first portion of the photoresist layer is covered by the first mask. A second mask including a second alignment pattern and a second layout pattern is provided. A second exposure process via a second mask and a second development process are performed so as to form a plurality of second wiring openings in a second portion of the photoresist layer, wherein an overlay portion of the first portion and the second portion of the photoresist layer are covered by the second mask, and the second alignment pattern of the second mask is substantially aligned with the first alignment opening formed in the photoresist layer when performing the second exposure process. The alignment mark is formed in the first alignment opening. The conductive wirings are formed in the first wiring openings and the second wiring openings.

According to some alternative embodiments, a method for fabricating a chip package including the following steps is provided. An insulating encapsulation is formed to laterally encapsulate sidewalls of at least one integrated circuit component. A conductive layer is formed on the at least one integrated circuit component and the insulating encapsulation. A photoresist layer is formed on the conductive layer and a multi-step exposure and development process is performed to pattern the photoresist layer. An alignment mark is formed in the photoresist layer. A plurality of conductive wirings are formed in the photoresist layer. The multi-step exposure and development process is performed to pattern the photoresist layer and the multi-step exposure and development process includes the following steps. A first mask including a first alignment pattern and a first layout pattern is provided. A first step exposure process via a first mask and a first development process are performed so as to form a first alignment opening and a plurality of first wiring openings in a first portion of the photoresist layer, wherein the first portion of the photoresist layer is covered by the first mask. A second mask including a second alignment pattern and a second layout pattern is provided. A second step exposure process via a second mask and a second development process are performed so as to form a plurality of second wiring openings in a second portion of the photoresist layer, wherein a part of the first portion and the second portion of the photoresist layer are covered by the second mask, and the second alignment pattern of the second mask are substantially aligned with the first alignment opening formed in the photoresist layer when performing the second step exposure process. The alignment mark is formed in the first alignment opening. The conductive wirings are formed in the first wiring openings and the second wiring openings, wherein the conductive wirings are electrically connected to the at least one integrated circuit component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating conductive wirings, comprising:
    patterning a photoresist layer, comprising:
        providing a first mask comprising a first layout pattern;
        performing a first exposure process via a first mask and a first development process to form a plurality of first wiring openings in a first portion of the photoresist layer, and the first portion of the photoresist layer being covered by the first mask;
        providing a second mask comprising a second layout pattern;
        performing a second exposure process via a second mask and a second development process to form a plurality of second wiring openings in a second portion of the photoresist layer, an overlay portion of the first portion and the second portion of the photoresist layer being covered by the second mask, the first wiring openings and the second wiring openings being communicated at the overlay portion, and the second layout pattern of the second mask being substantially aligned with the first wiring openings formed in the photoresist layer when performing the second exposure process; and
    forming the conductive wirings in the first wiring openings and the second wiring openings.

2. The method as claimed in claim 1, wherein the first layout pattern of the first mask comprises a first light-shielding pattern having a plurality of first light-transmissive regions corresponding to the first wiring openings, and the second layout pattern of the second mask comprises a second light-shielding pattern having a plurality of second light-transmissive regions corresponding to the second wiring openings.

3. The method as claimed in claim 1, wherein the first mask comprises a first overlay area corresponding to the overlay portion, and the second mask comprises a second overlay area corresponding to the overlay portion.

4. The method as claimed in claim 1, wherein a first width of the first wiring openings formed in the overlay portion is greater than a second width of the first wiring openings formed in the first portion which is not covered by the second mask.

5. The method as claimed in claim 1, wherein the conductive wirings comprises a plurality of first conductive segments formed in the first wiring openings and a plurality of second conductive segments formed in the second wiring openings.

6. The method as claimed in claim 5, wherein an overlay offset occurs between the first conductive segments and the second conductive segments.

7. A method for fabricating conductive wirings, comprising:
    patterning a photoresist layer, comprising:
        providing a first mask comprising a first alignment pattern and a first layout pattern;
        performing a first exposure process via a first mask and a first development process to form a first alignment opening and a plurality of first wiring openings in a first portion of the photoresist layer, and the first portion of the photoresist layer being covered by the first mask;
        providing a second mask comprising a second alignment pattern and a second layout pattern;
        performing a second exposure process via a second mask and a second development process to form a plurality of second wiring openings in a second portion of the photoresist layer, an overlay portion of the first portion and the second portion of the photoresist layer being covered by the second mask, and the second alignment pattern of the second mask being substantially aligned with the first alignment opening formed in the photoresist layer when performing the second exposure process;
    forming an alignment mark in the first alignment opening; and
    forming the conductive wirings in the first wiring openings and the second wiring openings.

8. The method as claimed in claim 7, wherein a second alignment opening aligned with the first alignment opening is further formed in the photoresist layer by performing the second exposure process and the second development process, and the alignment mark is formed in the first alignment opening and the second alignment opening.

9. The method as claimed in claim 7, wherein a second alignment opening spaced apart from the first alignment opening is further formed in the photoresist layer by performing the second step exposure process and the second development process, and the alignment mark is formed in the first alignment opening and the second alignment opening.

10. The method as claimed in claim 9, wherein the first alignment mark has an alignment notch and the second alignment mark extends into the alignment notch.

11. The method as claimed in claim 9, wherein the second alignment mark has an alignment notch and the first alignment mark extends into the alignment notch.

12. The method as claimed in claim 7, wherein the first layout pattern of the first mask comprises a first light-shielding pattern having a plurality of first light-transmissive regions corresponding to the first wiring openings, and the second layout pattern of the second mask comprises a second light-shielding pattern having a plurality of second light-transmissive regions corresponding to the second wiring openings.

13. The method as claimed in claim 7, wherein the first mask comprises a first overlay area corresponding to the overlay portion, the second mask comprises a second overlay area corresponding to the overlay portion, the first alignment pattern is distributed in the first overlay area of the first mask, the second alignment pattern is distributed in the second overlay area of the second mask, and the second overlay area of the second mask covers the first alignment opening formed in the photoresist layer.

14. A method for fabricating a chip package, comprising:
forming an insulating encapsulation to laterally encapsulate sidewalls of at least one integrated circuit component;
forming a conductive layer on the at least one integrated circuit component and the insulating encapsulation;
forming a photoresist layer on the conductive layer and performing a multi-step exposure and development process to pattern the photoresist layer, wherein performing the multi-step exposure and development process to pattern the photoresist layer comprises:
providing a first mask comprising a first alignment pattern and a first layout pattern;
performing a first step exposure process via a first mask and a first development process to form a first alignment opening and a plurality of first wiring openings in a first portion of the photoresist layer, and the first portion of the photoresist layer being covered by the first mask;
providing a second mask comprising a second alignment pattern and a second layout pattern;
performing a second step exposure process via a second mask and a second development process to form a plurality of second wiring openings in a second portion of the photoresist layer, a part of the first portion and the second portion of the photoresist layer being covered by the second mask, and the second alignment pattern of the second mask being substantially aligned with the first alignment opening formed in the photoresist layer when performing the second step exposure process;
forming an alignment mark in the first alignment opening; and
forming a plurality of conductive wirings in the first wiring openings and the second wiring openings, wherein the conductive wirings are electrically connected to the at least one integrated circuit component.

15. The method as claimed in claim 14, wherein a second alignment opening aligned with the first alignment opening is further formed in the photoresist layer by performing the second exposure process and the second development process, and the alignment mark is formed in the first alignment opening and the second alignment opening.

16. The method as claimed in claim 14, wherein a second alignment opening spaced apart from the first alignment opening is further formed in the photoresist layer by performing the second step exposure process and the second development process, and the alignment mark is formed in the first alignment opening and the second alignment opening.

17. The method as claimed in claim 16, wherein the first alignment mark has an alignment notch and the second alignment mark extends into the alignment notch.

18. The method as claimed in claim 16, wherein the second alignment mark has an alignment notch and the first alignment mark extends into the alignment notch.

19. The method as claimed in claim 14, wherein the first layout pattern of the first mask comprises a first light-shielding pattern having a plurality of first light-transmissive regions corresponding to the first wiring openings, and the second layout pattern of the second mask comprises a second light-shielding pattern having a plurality of second light-transmissive regions corresponding to the second wiring openings.

20. The method as claimed in claim 14, wherein the first mask comprises a first overlay area corresponding to the overlay portion, the second mask comprises a second overlay area corresponding to the overlay portion, the first alignment pattern is distributed in the first overlay area of the first mask, the second alignment pattern is distributed in the second overlay area of the second mask, and the second overlay area of the second mask covers the first alignment opening formed in the photoresist layer.

* * * * *